United States Patent
Audette et al.

(10) Patent No.: US 12,248,003 B2
(45) Date of Patent: Mar. 11, 2025

(54) CLUSTERED RIGID WAFER TEST PROBE

(71) Applicant: INTERNATIONAL BUSINESS MACHINES CORPORATION, Armonk, NY (US)

(72) Inventors: David Michael Audette, Colchester, VT (US); Grant Wagner, Jericho, VT (US); Peter William Neff, Cambridge, VT (US); Jacob Louis Moore, Milton, VT (US); Melissa Keefe, Cortlandt Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 188 days.

(21) Appl. No.: 18/062,096

(22) Filed: Dec. 6, 2022

(65) Prior Publication Data

US 2024/0183880 A1 Jun. 6, 2024

(51) Int. Cl.
*G01R 1/067* (2006.01)
*G01R 1/073* (2006.01)

(52) U.S. Cl.
CPC .......... *G01R 1/067* (2013.01); *G01R 1/07342* (2013.01)

(58) Field of Classification Search
CPC ............................ G01R 1/067; G01R 1/07342
USPC ..................................................... 324/754.07
See application file for complete search history.

(56) References Cited

U.S. PATENT DOCUMENTS

| | | | | |
|---|---|---|---|---|
| 5,015,191 A | * | 5/1991 | Grabbe | H01R 12/714 439/71 |
| 5,228,861 A | * | 7/1993 | Grabbe | H01R 12/52 439/591 |
| 5,313,157 A | * | 5/1994 | Pasiecznik, Jr. | G01R 1/0735 324/755.09 |
| 5,420,461 A | * | 5/1995 | Mallik | H01L 24/81 361/776 |
| 5,973,394 A | | 10/1999 | Slocum | |
| 6,249,114 B1 | | 6/2001 | Sakai | |
| 6,627,092 B2 | * | 9/2003 | Clements | H05K 3/4092 438/618 |
| 6,888,362 B2 | * | 5/2005 | Eldridge | G01R 1/07342 324/755.07 |

(Continued)

OTHER PUBLICATIONS

Disclosed Anonymously, "Low-Force Interconnect Coining," IP.com No. IPCOM000261343D, Feb. 24, 2020, 3 pages.

*Primary Examiner* — Christopher P McAndrew
(74) *Attorney, Agent, or Firm* — Matthew Zehrer

(57) ABSTRACT

An IC device test probe has one or more clusters of a plurality of tapered probe tips that taper upon a taper plane that is orthogonal to a seating direction or force vector of the IC device test probe toward the IC device. Each of the plurality of tapered probe tips is seated against one contact of the IC device. In this manner, the IC device test probe is seated against multiple contacts and may therefore apply test signal(s) to these contacts serially, simultaneously, or the like. The IC device test probe allows the seating to small pitch IC devices and associated testing thereof. This allows for electrical characterization of the IC device by the same test signal(s) through the IC device test probe and ultimately through multiple contacts. The forces associated with seating the IC device test probe against the IC device contacts is effectively spread across multiple contacts.

20 Claims, 11 Drawing Sheets

(56) References Cited

U.S. PATENT DOCUMENTS

| | | | |
|---|---|---|---|
| 6,890,185 B1 * | 5/2005 | Kister | H01R 13/2428 |
| | | | 439/66 |
| 6,980,017 B1 * | 12/2005 | Farnworth | H05K 3/326 |
| | | | 324/755.07 |
| 7,026,697 B2 * | 4/2006 | Sherrer | G01L 9/0042 |
| | | | 257/254 |
| 7,059,865 B2 * | 6/2006 | Kister | G01R 1/06711 |
| | | | 439/66 |
| 7,113,408 B2 * | 9/2006 | Brown | H05K 7/1069 |
| | | | 361/773 |
| 9,217,758 B2 | 12/2015 | Torreiter | |
| 9,231,328 B2 * | 1/2016 | Rathburn | H01R 13/2485 |
| 9,277,654 B2 * | 3/2016 | Rathburn | H05K 3/325 |
| 9,726,691 B2 | 8/2017 | Garibay | |
| 9,817,029 B2 | 11/2017 | Wang | |
| 10,001,508 B2 | 6/2018 | Liu | |
| 2004/0252477 A1 * | 12/2004 | Brown | H01R 43/007 |
| | | | 361/830 |
| 2006/0091384 A1 | 5/2006 | Ho | |

\* cited by examiner

CLUSTERED RIGID WAFER TEST PROBE

FIELD

Embodiments of disclosure generally relate to integrated circuit (IC) devices, such as dies, wafers, or the like, and IC device test probes, such as a wafer probe. More particularly, embodiments relate to an IC device test probe that includes a plurality of tapered probe tips.

BACKGROUND

An IC device tester is a system used for electrical testing or electrically characterizing of IC devices. Test signals from the IC device tester are transmitted to the IC device by way of one or more probe structures and the test signals are then returned from the IC device for analysis. After the test, the probe structure(s) are separated from contacts of the IC device.

An important facet of the IC device industry resides in being able to provide satisfactorily functioning IC devices. In particular, such IC devices may comprise wafers which are divided into areas which form chips, the shapes and dimensions of which are as close to identical as possible, so as to impart consistent uniform electrical properties thereto.

Generally, IC devices on chips are ordinarily connected to each other with thin strips of metal, referred to in the art as interconnection metallurgy, which in turn contact the wafer surface through a series of pads or bumps. Other connector pad configurations may include an array of electrical contacts or bumps which are distributed over an area; for instance, the widely employed C4 contacts (controlled collapse chip connects). Such contacts extend above the IC device and have a generally spherical or round cross-sectional configuration.

Although IC device wafers are formed as uniformly as possible through current manufacturing techniques, it is not always feasible that every chip produced is perfect. In order to identify defective IC devices, electrical tests are performed to facilitate the sorting out of good IC devices and eliminating defective IC devices prior to the next step of manufacture.

Ordinarily, active testing of the wafers is performed by a test facility in which the contacts are probed by an assembly incorporating test probes. In order to successfully probe the integrity of the contacts, it is desirable that an oxide layer, which inevitably forms on the surface of the contacts, be ruptured and penetrated to ensure good electrical contact with the probe while employing only a minimal force to inhibit damaging the pads or bumps.

Further, as the pitch between contacts and the size of IC device contacts continue to shrink, it is becoming increasingly difficult to probe individual IC device contacts with an independent or sovereignly managed probe structure. For example, known independent probe structure(s) may be too large or exert unfavorably high forces to modern and relatively smaller individual IC device contacts, such as micro C4 solder bumps. These challenges may be of particular concern when modern IC device contacts, such as micro C4 solder bumps, are utilized upon or within traditional organic laminates, wafers, or the like.

SUMMARY

In an embodiment of the present disclosure, a system to test an integrated circuit (IC) device is provided. The system includes an IC device that includes a grid of contacts arranged in rows and columns. The system further includes a first IC device test probe that includes a first cluster of a first plurality of rigid and integrated tapered probe tips that taper upon a taper plane that is orthogonal to a seating direction of the first IC device test probe toward the IC device.

In utilization of this embodiment of the disclosure, the IC device test probe may be seated against the first sub-grid of contacts. The IC device test probe may apply the same test signal(s) to multiple contacts simultaneously, serially, iteratively, or the like. In other words, one independent IC device test probe may apply test signal(s) to multiple contacts. The IC device test probe enables the seating of the IC device test probe with small contact pitch IC devices due to a distribution of forces associated with seating the IC device test probe across the multiple contacts, which may relatively limit or reduce potential damage to the contacts.

In an example, the first IC device test probe is configured to pass a test signal though the first cluster of the first plurality of rigid and integrated tapered probe tips to a first sub-grid of contacts arranged in rows and columns once seated against the first plurality of rigid and integrated tapered probe tips.

In an example, the system further includes a second IC device test probe that includes a second cluster of a second plurality of rigid and integrated tapered probe tips that taper upon the taper plane. In an example, the second IC device test probe is configured to receive the test signal though the second cluster of the second plurality of rigid and integrated tapered probe tips from one or more second sub-grid of contacts arranged in rows and columns once seated against the second plurality of rigid and integrated tapered probe tips.

In an example, the IC device includes at least one electrical pathway that electrically connects at least one of the first sub-grid of contacts to at least one of the second sub-grid of contacts. In an example, the grid of contacts is a n×n grid of contacts, wherein the first sub-grid of contacts is a subset of n×n grid of contacts. In an example, a pitch between neighboring contacts of the n×n grid of contacts is an integer multiple of a pitch between neighboring rigid and integrated tapered probe tips.

In an example, the first cluster of the first plurality of rigid and integrated tapered probe tips is described. This first cluster includes a probe tester normal surface that is coplanar with the taper plane. Each of the first plurality of rigid and integrated tapered probe tips share the probe tester normal surface. This first cluster further includes a plurality of corner taper tips, with one corner taper tip being located at each corner of a square region. This first cluster further includes a plurality of mesial taper tips, with one mesial taper tip being located between neighboring corner taper tips. This first cluster further includes a through hole from the probe tester normal surface and an internal taper tip within the through hole.

In an example, the first cluster of the first plurality of rigid and integrated tapered probe tips that share the probe tester normal surface provide respective adequately sharp tip structures to shear an oxide barrier of a respective associated contact of the first sub-grid of contacts.

In an example, the first IC device test probe self-aligns to the first sub-grid of contacts and/or the first cluster of the first plurality of rigid and integrated tapered probe tips distributes join forces between the IC device and the first IC device test probe across the first sub-grid of contacts.

In another embodiment of the disclosure, a system to test an integrated circuit (IC) device is provided. The system includes an IC device that has a grid of contacts arranged in rows and columns. The system further includes a first IC device test probe that includes a plurality of first clusters. Each first cluster includes a first plurality of rigid and integrated tapered probe tips that taper upon a taper plane that is orthogonal to a seating direction of the first IC device test probe toward the IC device.

In an example, the first IC device test probe is configured to pass a test signal though the plurality of first clusters to a first sub-grid of contacts arranged in rows and columns once seated against the first plurality of rigid and integrated tapered probe tips.

In an example, the system also includes a second IC device test probe that includes a plurality of second clusters. Each second cluster includes a second plurality of rigid and integrated tapered probe tips that taper upon the taper plane.

In an example, the second IC device test probe is configured to receive the test signal though the plurality of second clusters from a second sub-grid of contacts arranged in rows and columns once seated against the second plurality of rigid and integrated tapered probe tips.

In an example, at least one electrical pathway electrically connects at least one of the first sub-grid of contacts to at least one of second sub-grid of contacts. In an example, the grid of contacts is a n×n grid of contacts, the first sub-grid of contacts is a subset of n×n grid of contacts, and a pitch between neighboring contacts of the n×n grid of contacts is an integer multiple of a pitch between neighboring rigid and integrated tapered probe tips.

In an example, each first cluster further includes a probe tester normal surface that is coplanar with the taper plane. Each of the first plurality of rigid and integrated tapered probe tips share the probe tester normal surface. Each first cluster further includes a plurality of corner taper tips, with the corner taper tips being located at each corner of a square region. Each first cluster further includes a plurality of mesial taper tips, with the mesial taper tips being located between respective corner taper tips. Each first cluster further includes a through hole from the probe tester normal surface and an internal taper tip within the through hole.

In an example, the first plurality of rigid and integrated tapered probe tips that share the probe tester normal surface provides for respective adequately sharp tip structures to shear an oxide barrier of a respective associated contact of the first sub-grid of contacts. In an example, the first IC device test probe self-aligns to the first sub-grid of contacts and a plurality of first clusters distributes join forces between the IC device and the first IC device test probe across the first sub-grid of contacts.

In another embodiment of the disclosure, a method of testing an integrated circuit (IC) device is provided. The method includes vertically seating a first IC device test probe and a second IC device test probe upon an IC device. The method includes transmitting a test signal to a first IC device test probe comprising a first cluster of a first plurality of rigid and integrated tapered probe tips that taper upon a horizontal taper plane. The method further includes passing the test signal though the first cluster of the first plurality of rigid and integrated tapered probe tips to a first sub-grid of contacts of the IC device. The first sub-grid is arranged in rows and columns. The method further includes receiving the test signal though a second cluster of a second plurality of rigid and integrated tapered probe tips from a second sub-grid of contacts of the IC device. The second sub-grid of contacts arranged in rows and columns.

These and other embodiments, features, aspects, and advantages will become better understood with reference to the following description, appended claims, and accompanying drawings.

BRIEF DESCRIPTION OF THE DRAWINGS

So that the manner in which the above recited features of the present disclosure are attained and can be understood in detail, a more particular description of the disclosure, briefly summarized above, may be had by reference to the embodiments thereof which are illustrated in the appended drawings.

It is to be noted, however, that the appended drawings illustrate only typical embodiments of this disclosure and are therefore not to be considered limiting of its scope, for the disclosure may admit to other equally effective embodiments.

The drawings are not necessarily to scale. The drawings are merely schematic representations, not intended to portray specific parameters of the disclosure. The drawings are intended to depict only exemplary embodiments of the disclosure. In the drawings, like numbering represents like elements.

DETAILED DESCRIPTION

Figure 1:
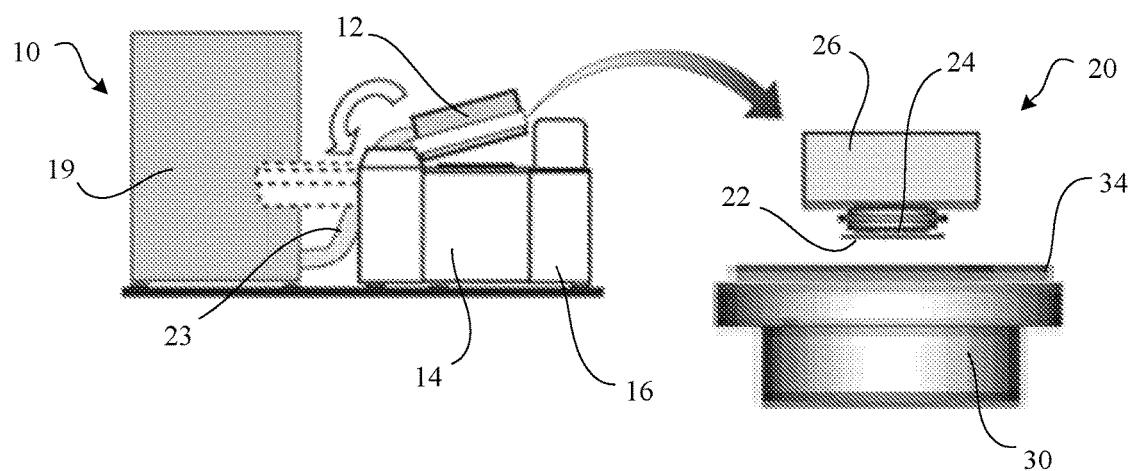
FIG. 1 depicts views of an exemplary IC device tester which may implement one or embodiments of the disclosure.

Detailed embodiments of the claimed structures and methods are disclosed herein; however, it can be understood that the disclosed embodiments are merely illustrative of the claimed structures and methods that may be embodied in various forms. These exemplary embodiments are provided so that this disclosure will be thorough and complete and will fully convey the scope of this disclosure to those skilled in the art. In the description, details of well-known features and techniques may be omitted to avoid unnecessarily obscuring the presented embodiments.

Referring now to the drawings, wherein like components are labeled with like numerals, exemplary structures of a semiconductor device, in accordance with embodiments of the disclosure are shown and will now be described in greater detail below. The specific number of components depicted in the figures and the cross-section orientation was chosen to best illustrate the various embodiments described herein.

FIG. 1 depicts views of an exemplary IC device tester 10 which may implement one or embodiments of the disclosure. IC device tester 10 may include a test head 12, an IC wafer prober 14, a wafer loader 16, a tester 19, and a cable 23. Test head 12 may be rotatable relative to IC wafer prober 14, and wafer loader 16. Test head 12 includes head assembly 20. IC wafer prober 14 includes wafer chuck 30 and may also include a robotic arm that, for example, moves an IC device 34, such as a wafer, from wafer loader 16 to IC device chuck 30 and from IC device chuck 30 back to wafer loader 16.

Head assembly 20 may include a probe card 22, a probe head 24, and a head body 26. The wafer chuck 30 may be movable relative to the head assembly 20. Probe head 24 electrically and mechanically connects the probe card 22 to the head body 26. In accordance with the embodiments of the disclosure, one or more IC device test probes may be located upon probe card 22. Each of the one or more IC device test probes include a plurality of tapered probe tips. To conduct a test of IC device 34, the wafer chuck 30 moves the IC device 34 relative to the IC device probes and seats each of the one or more IC device test probes onto the IC device 34. For example, each one of the plurality of tapered probe tips may be temporarily pressed into one contact of the IC device 34.

Test signals from the IC device tester 10 are transmitted from the tester 19 by cable 23 to the head body 26. These test signals are then transferred from the head body 26 to the probe card 22, to the probe head 24, to at least a first IC device test probe and ultimately to associated contacts of IC device 34. The test signals are then routed through wafer 34 and returned from the wafer to tester 19 for analysis. For example, a second IC device test probe receives the test signals that have been routed through wafer 34 and then these received test signals are sent to tester 19 for analysis. In a particular analysis scheme, the received test signals are compared against an expected or predetermined set of test data, associated with the original test signals, to determine whether the signal carrying or routing pathways within the IC device 34 transmit the test signals accurately or otherwise as expected.

In an example, a first die of a first IC device 34 (e.g., first die of a first wafer) may be tested. Subsequently, wafer chuck 30 may unseat, disconnect, disengage, or the like, the IC device test probes from the first IC device 34 and move the IC device 34 relative to the probe card 22 and may test a different or second die of first IC device 34. In other examples, the probe card 22 need not be moved to test the second die of the first IC device 34, to test the entire first IC device. Once the testing of the first IC device 34 is completed, IC device tester 10 may move the tested IC device 34 back to wafer loader 16, and IC device tester 10 may move a new or second IC device 34 (e.g., second wafer) from wafer loader 16 to wafer chuck 30 for testing.

Figure 2:
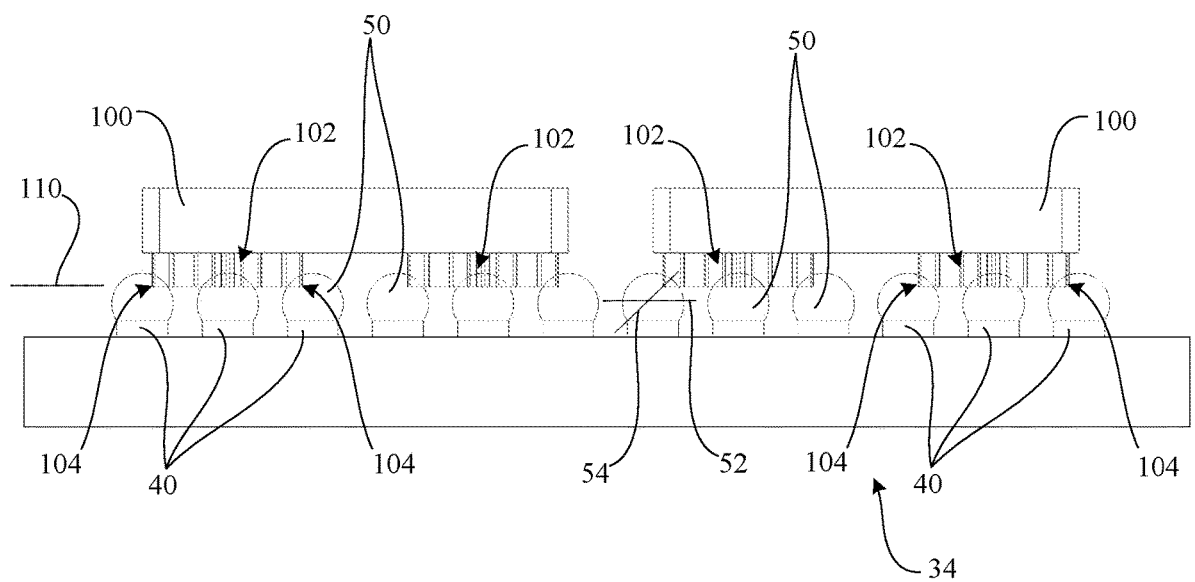
FIG. 2 depicts a cross section view of an IC device test probe that includes a plurality of tapered probe tips seated against an IC device, in accordance with one or more embodiments of the disclosure.

FIG. 2 depicts a cross section view one or more IC device test probes 100 that respectively include one or more clusters 102 of tapered probe tips. In the cross-section view depicted, the one or more IC device test probes 100 are seated against IC device 34 (e.g., each one of the plurality of tapered probe tips are pressed into a respective different contact 50 of IC device 34).

Contact 50 is a ductile, conductive material, such as solder. In an example, the plurality of contacts 50 may be C4 micro solder bumps, or the like. One contact 50 is bonded to one respective underlying pad 40. Pad 40 is a conductive material, such as copper, tungsten, gold, or the like. The pads 40 and contacts 50 may be arranged in a grid of columns and rows with a micrometer pitch or distance between neighboring pads 40 and contacts 50 in the same row and/or column. For example, there may be a 25 um pitch between respective centers of neighboring pads 40 and between respective centers of neighboring contacts 50. In this case, the test probe 100 comprises a 6×6 sub-array of contacts 50 that represents an integer multiple of a larger 150 um pitch between neighboring tapered probe tips upon the test probe(s) 100.

Each contact 50 and pad 40 is mechanically and electrically connected to a respective one or more wiring features or combination of wiring features, such as wires, traces, planes, VIAs, or the like. The wiring features may be electrically and/or mechanically connected to an IC microdevice, such as a transistor, diode, storage cell, array, gate, logic gate, or the like. The respective one or more wiring features or combination of wiring features, microdevices, and the like, may together form respective one or more wiring pathways or through the IC device 34. In examples, two or more different contacts 50 may be a part of the same wiring pathway or related wiring pathways. In this example, a test signal applied at a first contact 50 or a first sub-array of contacts 50 may be routed through the IC device 34 by way of the wiring pathway(s) and read at the second contact 50 and/or a second sub-array of contacts 50.

The one or more IC device test probes 100 includes a plurality of clusters 102 of tapered probe tips. Each cluster 102 includes a plurality of tapered probe tips that are each tapered upon or with respect to a same taper plane 110. As such, the thickness of the tapered probe tips diminishes or reduce in dimension toward a respective probe tip head at the permitter of the associated cluster 102 upon the taper plane 110. As depicted, a first plurality of tapered probe tips included in a first cluster 102 and a second plurality of tapered probe tips included in a second cluster 102 may share the same taper plane 110. Taper plane 110 is generally parallel to IC device 34. Each tapered probe has an orthogonal or substantially orthogonal (orthogonal plus or minus an appropriate manufacturing tolerance) corner 104, hereinafter referred to as orthogonal corner 104.

The orthogonal corner 104 of each tapered probe tips, the integration or combined nature of multiple tapered tips into a single cluster or structure, rigidity of the material of the tapered tips, and the like, may provide for and adequately sharp tip structure to shear the oxide barrier of a respective associated contact 50 to which each tapered probe tip is pressed. Specifically, the support of these tapered probe tips by an integrated ring structure (square ring region, circular ring region, or the like) increases the strength of the probe tapered probe tips and reduces the stress of the tapered probe tips generated during contact with a corresponding contact. This configuration allows for the use of relatively smaller features, thereby achieving a lower force performance than required by a probe having a free-standing pin or needle probe. In addition, these smaller, sharper, strategically placed tapered probe tips impart higher localized stress on the contacts 50 for purpose of piercing the oxide layer, while minimizing global deformation.

To test the IC device 34, the one or more IC device test probes 100 are temporarily seated against IC device 34 by IC wafer prober 14. For example, the orthogonal corner 104 of each tapered probe tip head is pressed into a respective different contact 50 of IC device 34. Because contact 50 is ductile, contact 50 deforms around the orthogonal corner 104 of the tapered probe tip head. Upon such deformation, any oxide barrier is broken, and an adequate mechanical and electrical connection exists to transmit electrical current, signals, or the like, from the tapered probe tip head to contact 50, or vice versa. In this example, the IC device test probe(s) may be adequately or desirably seated onto the IC device 34 when a respective probe tip head adequately breaks the oxide barrier of the associated contact 50 to which it is pressed.

In another example, a respective equator plane 52 may exist through the equator of each contact 50. Each of the equator planes may be coplanar and may be parallel to taper plane 110. A quarter bisector 54 may exist at a forty-five-degree angle from the equator plane. In this example, the IC device test probe(s) may be adequately or desirably seated onto the IC device 34 when a respective probe tip head meets an appropriate and respective quarter bisector 54 and/or when the appropriate respective quarter bisector 54 bisects the associated orthogonal corner 104 of the probe tip head.

After seating the one or more IC device test probes 100 against IC device 34 by IC wafer prober 14 test signal(s) are applied by a first IC device test probe 100 at a first contact 50 or a first sub-array of contacts 50. A test signal(s) are a predetermined one or more, a series of one or more, digital signal(s) such as predetermined potential pattern(s), power potential, ground potential, or the like.

The test signal(s) are routed through the IC device 34 by way of the wiring pathway(s) and may be read at a second contact 50 and/or a second sub-array of contacts 50 at a second IC device test probe 100. That is, a respective instance of the same test signal(s) is applied to each contact 50 that is seated against the tapered probe tips of the first IC device test probe 100. After the test signal(s) are routed through the IC device 34 by way of the wiring pathway(s) the test signal(s) are received at the tapered probe tips of the second IC device test probe 100. An aggregation of the received test signal(s) may be received at tester 19 from the second IC device test probe 100 for comparison against a known, predetermined, or otherwise expected set of test data, associated with the original test signals. Based on the comparison, tester 19 determines whether the wiring pathway(s) within the IC device 34 have transmitted the test signals accurately or otherwise as expected.

In embodiments, the tapered probe tip heads of the same cluster 102 may be pressed into one contact 50 that is a part of a sub-grid of contacts 50 that is organized into rows and columns. For example, and as depicted, each one of nine tapered probe tip heads of the same cluster 102 may be pressed into one contact 50 of a 3×3 sub-grid of contacts 50 that is organized in rows and columns. Further, multiple clusters 102 may be positioned relative to one another upon IC device test probe 100 to enlarge the size of the associated sub-grid of contacts 50 that is organized in rows and columns. In the depicted example, that includes four clusters 102 upon one IC device test probe 100, each one of thirty-six tapered probe tip heads of the same IC device test probe 100 may be pressed into one contact 50 of a 6×6 sub-grid of contacts 50 that is organized in rows and columns.

Therefore, in the depicted example, a respective instance of the same test signal(s) is applied to each contact 50 of the 6×6 sub-grid of contacts 50 by a respective seated tapered probe tip of the first IC device test probe 100. After the test signal(s) are routed through the IC device 34, by way of the wiring pathway(s), the test signal(s) are received at each contact 50 of a 6×6 sub-grid of contacts 50 by a respective seated tapered probe tip of the second IC device test probe 100.

Figure 3:
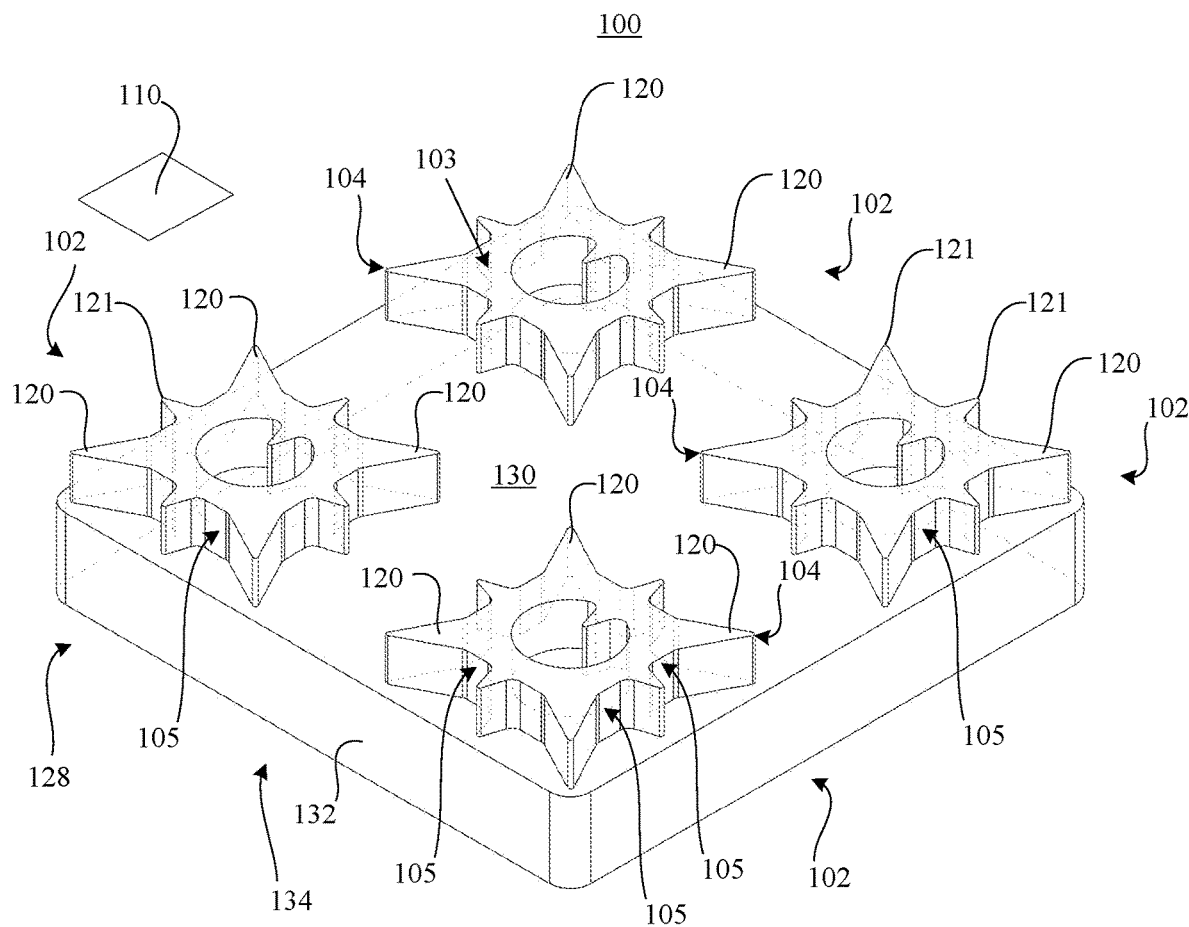
FIG. 3 depicts an isometric view of an IC device test probe that includes a plurality of tapered probe tips, in accordance with one or more embodiments of the disclosure.
Figure 4:
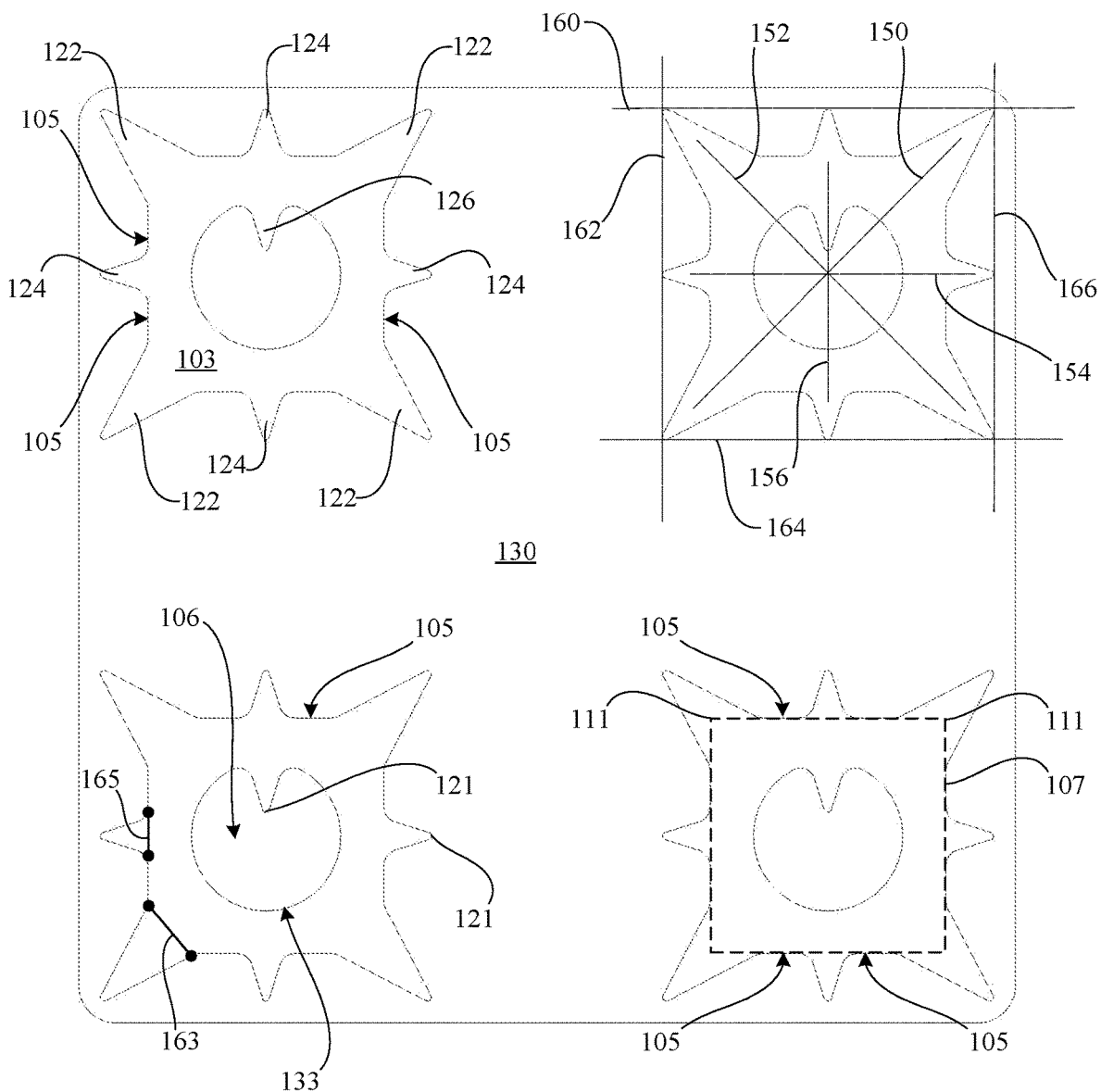
FIG. 4 depicts a normal view of an IC device test probe that includes a plurality of tapered probe tips, in accordance with one or more embodiments of the disclosure.
Figure 5:
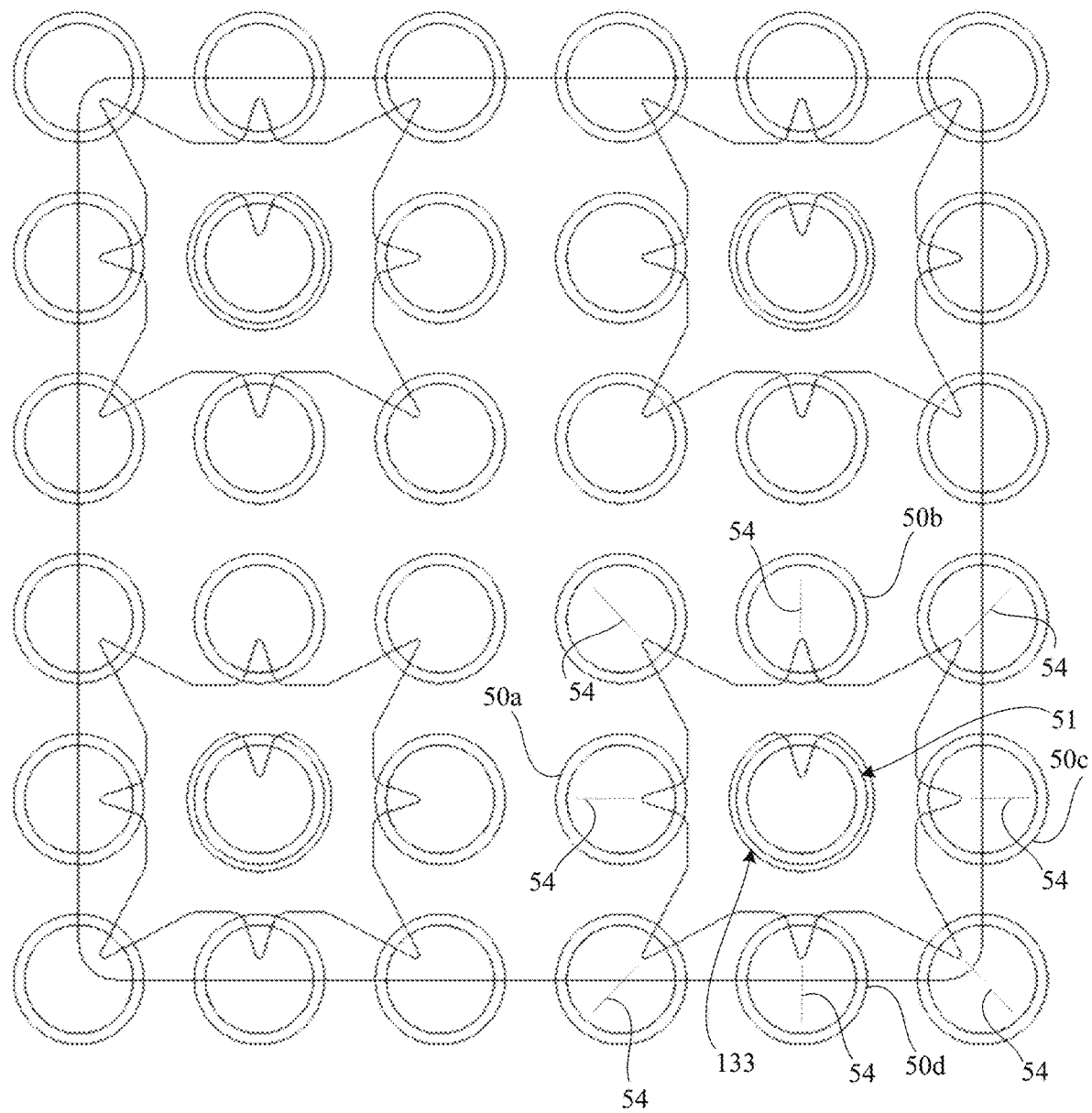
FIG. 5 depicts a relational view a plurality of tapered probe tips when seated against an IC device, in accordance with one or more embodiments of the disclosure.

Referring to FIG. 3, FIG. 4, and FIG. 5, which depict various views of IC device test probe 100 that includes a plurality of clusters 102 of tapered probe tips 120 that project or extend from a base 128. Base 128 includes an IC device 34 facing surface 130, hereinafter referred to as bottom surface 130, an opposing surface 134, hereinafter referred to a top surface 134, and one or more sidewalls 132 that connect the bottom surface 130 to the top surface 134. Base 128 is formed of a conductive material, such as a metal. In a particular example, base 128 is a shaped block of copper or other metal. Base 128 may be mechanically and electrically bonded to probe card 22. As such, test signal(s) may be transmitted through probe card 22 into base 128 and ultimately into the clusters 102 thereupon.

The IC device test probe 100 includes a plurality of clusters 102 of tapered probe tips 120. Though four clusters 102 are depicted, IC device test probe 100 may include additional or fewer clusters 102. Each cluster 102 includes a plurality of tapered probe tips 120 that are each tapered upon or with respect to taper plane 110, such that the thickness of each tapered probe tip 120 diminishes toward a respective probe tip head 121 at the permitter of the associated cluster 102 upon the taper plane 110. Cluster 102 is formed of a conductive material, such as a metal. In a particular example, cluster 102 is plated copper or other metal, and can include surface plating with a noble metal. Cluster(s) 102 are typically formed by photolithographic plating processes onto surface 130 of base 128. Generally, the test signal(s) received by base 128 from probe card 22 are generally received by the clusters 102 thereupon and more specifically received by the tapered probe tips 120 associated therewith.

Each cluster 102 includes a probe tester normal surface 103, which may be coplanar with taper plane 110 and/or parallel with bottom surface 130. Each cluster 102 further includes sidewalls that connect the probe tester normal surface 103 with bottom surface 130. The sidewalls of each cluster 102 may include sidewalls 105 that may be coplanar with a respective square region 107. Square region 107 may be coplanar with taper plane 110 and/or parallel with bottom surface 130 and may include vertices 111.

As is depicted, the tapered probe tips 120 of one cluster 102 are interconnected, integral, integrated, or the like, to one another and may effectively form a sufficiently strong, hard, and/or rigid structure of multiple tapered probe tips 120. Specifically, the support of these tapered probe tips 120 to the same integrated ring structure increases the strength of the probe tapered probe tips 120 and reduces the stress of the tapered probe tips 120 generated during contact with a corresponding contact 50. This configuration allows for the use of relatively smaller probe tapered probe tips 120, thereby achieving a lower force performance than required by a probe having a free-standing pin or needle probe. In addition, these smaller, sharper, strategically placed tapered probe tips impart higher localized stress on the contacts 50 for purpose of piercing the oxide layer, while minimizing global deformation.

Further, the tapered probe tips 120 upon the IC device test probe 100 may effectively self-align the IC device test probe 100 to the IC device 34. Specifically, each tapered probe tip 120 may be configured to contact a spherical or spherical like contact 50 at a location offset from a vertical bisector of that contact 50. When a tapered probe tip 120 contacts or hits a contact 50, tapered probe tip 120 is hitting on the side of contact 50 and will have a natural tendency to be pushed away. This tendency effectively acts on all tapered probe tip 120 IC device test probe 100 and may effectively align the IC device test probe 100 with IC device 34.

With such an arrangement, the tapered probe tips 120 are generally configured to contact a portion of the contact 50 offset from a central vertical axis thereof. As a result, the center of the C4 contact 50 remains undisturbed through the testing, thereby eliminating the need for a reflow operation. In addition, the orientation and contour of the tapered probe tips 120 may be selected to apply a lateral force on the associated contact 50 to urge the corresponding contact 50 into a desired self-aligned position. By including a plurality of tapered probe tips 120 positioned about the periphery of the ring structure, the tapered probe tips 120 ensure proper self-alignment between the IC device test probe 100 and the sub-grid of contacts 50 regardless of the direction of offset of the contact 50 relative to the tapered probe tips 120 of the IC device test probe 100.

Each cluster 102 may further include one or more bisectors that are orthogonal to probe tester normal surface 103. In an example, each cluster 102 includes diagonal bisector 150, diagonal bisector 152, normal bisector 154, and normal bisector 156. Diagonal bisector 150, diagonal bisector 152, normal bisector 154, and normal bisector 156 may be respective planes orthogonal to bottom surface 130. As depicted in FIG. 4, diagonal bisector 150 may be orthogonal to diagonal bisector 152 and normal bisector 154 may be orthogonal to normal bisector 156. The diagonal bisector 150, diagonal bisector 152, normal bisector 154, and normal bisector 156 may bisect respective square region 107. Opposite diagonal vertices 111 of square region 107 may lay upon or be otherwise coincident with the same diagonal bisector 150, 152, respectively. As such, diagonal bisector 150 and diagonal bisector 152 diagonally bisect square region 107. Normal bisector 154 may bisect a front side from a rear side of square region and normal bisector 156 may bisect a first side from a second side of square region 107.

Each cluster 102 may further include through-hole 106 internal to sidewalls 105 and/or square region 107. Through-hole 106 is generally a void of the material of cluster 102 and/or base 128 and may extend all the way through cluster 102 from probe tester normal surface 103 to or below bottom surface 130. Through-hole 106 may have a diameter 133 that is larger than the diameter of contacts 50 of IC device 34. For example, diameter 133 may be larger than the diameter of contacts 50 of IC device 34 by a predetermined dimension that adequately allows for a respective clearance between all through-holes 106 and associated contacts 50 while considering appropriate manufacturing tolerances, locational tolerances, and placement tolerances, and/or the like. Through-hole 106 generally forms internal sidewall(s) of cluster 102 that connect probe tester normal surface 103 to bottom surface 130, or the like.

The tapered probe tips 120 of each cluster 102 may be respective permitter regions that may extend from one or more sidewalls of respective cluster 102. The tapered probe tips 120 may include corner taper tips 122, mesial taper tips 124, and interior taper tip 126.

Both corner taper tips 122 and mesial taper tips 124 taper upon taper plane 110 such that a thickness of the corner taper tips 122 and mesial taper tips 124 diminish or reduce in dimension from square region 107 toward a respective probe tip head 121 thereof. Diagonal bisector 150 may bisect a first pair of opposing corner taper tips 122 and diagonal bisector 152 may bisect a second pair of opposing corner taper tips 122. Similarly, bisector 154 may bisect a first pair of opposing mesial taper tips 124 and bisector 156 may bisect a second pair of opposing mesial taper tips 124. Due to a longer distance from vertices 111 to the probe tip head 121 of corner taper tip 122 relative to the distance from square region 107 to the probe tip head 121 of mesial taper tip 124, a largest or base taper dimension 163 of the corner taper tip 122 upon taper plane 110 may be greater than a largest or base taper dimension 165 of mesial taper tip 124 upon taper plane 110.

Interior taper tip 126 taper upon taper plane 110 such that a thickness of the interior taper tip 126 diminish or reduce in dimension from the internal sidewall(s) of through-hole 106 toward a respective probe tip head 121 thereof. Diagonal bisector 150, diagonal bisector 152, bisector 154, bisector 156, or the like, may bisect interior taper tip 126.

Respective probe tip heads 121 of each cluster 102 may be located upon perimeter planes 160, 162, 164, and 166 that are orthogonal to probe tester normal surface 103. Perimeter plane 160 and permitter plane 164 may be parallel and perimeter plane 162 and permitter plane 166 may be parallel. Perimeter plane 160, 164 may be orthogonal to perimeter plane 162, 166. As depicted, perimeter planes 160, 162, 164, 166 may be shaped relative thereto as a square that has a center that may be coincident with a center of square region 107 and/or a center of through-hole 106. In an example, a first group of probe tip heads 121 of corner taper tips 122 and mesial taper tips 124 may lay upon or be otherwise coincident with perimeter plane 160, a second group of probe tip heads 121 of corner taper tips 122 and mesial taper tips 124 may lay upon or be otherwise coincident with perimeter plane 162, a third group of probe tip heads 121 of corner taper tips 122 and mesial taper tips 124 may lay upon or be otherwise coincident with perimeter plane 164, and a fourth group of probe tip heads 121 of corner taper tips 122 and mesial taper tips 124 may lay upon or be otherwise coincident with perimeter plane 166.

Corner taper tips 122, mesial taper tips 124, and interior taper tip 126 may have a respective rounded probe tip head 121. Sidewall(s) may connect probe tester normal surface 103 of corner taper tips 122, mesial taper tips 124, and interior taper tip 126 to bottom surface 130. Each tapered probe tip 120 may have orthogonal corner 104 that is formed between bottom surface 130 and the sidewall(s) of corner taper tips 122, sidewall(s) of mesial taper tips 124, and sidewall(s) of interior taper tip 126, respectively.

As depicted in FIG. 5, to test the IC device 34, IC device test probe 100 is temporarily seated against IC device 34 by IC device tester 10. For example, the orthogonal corner 104 of each tapered probe tip head 121 is pressed into a respective different contact 50 of IC device 34. These associated contacts 50 may be arranged in a sub-grid of rows and columns. Because the contacts 50 are ductile, each sub-grid of contacts 50 deforms around the orthogonal corner 104 of each of the tapered probe tip heads 121. In this example, the IC device the tapered probe tips 120 may be adequately or desirably seated onto the IC device 34 when a respective probe tip head 121 adequately breaks the associated oxide barrier of the contact 50 to which it is pressed.

In another example, the IC device test probe 100 may be adequately or desirably seated onto the IC device 34 when a respective probe tip head 121 meets an appropriate and respective quarter bisector 54 and/or when the appropriate respective quarter bisector 54 bisects the associated orthogonal corner 104 of the probe tip 120. With reference to both FIG. 4 and FIG. 5, when IC device test probe 100 is properly aligned with and/or seated with IC device 34, diagonally opposite quarter bisectors 54 may be coincident with diagonal bisector 150 or diagonal bisector 152, as appropriate, and opposite mesial quarter bisectors 54 may be coincident with bisector 154 or diagonal bisector 156, as appropriate.

Upon such deformation, an adequate mechanical and electrical connection exists to transmit electrical current, signals, or the like, from the tapered probe tip 120 to the associated contact 50, or vice versa. After IC device tester 10 seats IC device test probe 100 against IC device 34, test signal(s) are applied by the IC device test probe 100 and applied to respective contacts 50. The test signal(s) are then routed through the IC device 34 by way of the wiring pathway(s). In embodiments, the tapered probe tip heads 121 of the same cluster 102 may be pressed into one contact 50 that is a part of a respective sub-grid of contacts 50 that are organized into rows and columns. For example, and as depicted in FIG. 5, each one of nine tapered probe tip heads 121 of the same cluster 102 may be pressed into one contact 50 of a 3×3 sub-grid of contacts 50 that is organized in rows and columns. Further, multiple clusters 102 may be positioned relative to one another upon IC device test probe 100 to enlarge the size of the associated sub-grid of contacts 50 that is organized in rows and columns. As depicted in FIG. 5, four clusters 102 are included in IC device test probe 100, each one of thirty-six tapered probe tip heads 121 of the same IC device test probe 100 may be pressed into one contact 50 of a 6×6 sub-grid of contacts 50 that are organized in rows and columns. Therefore, in the depicted example, a respective instance of the same test signal(s) is applied to each contact 50 of the 6×6 sub-grid of contacts 50 by a respective seated tapered probe tip 120 of the IC device test probe 100.

Figure 6:
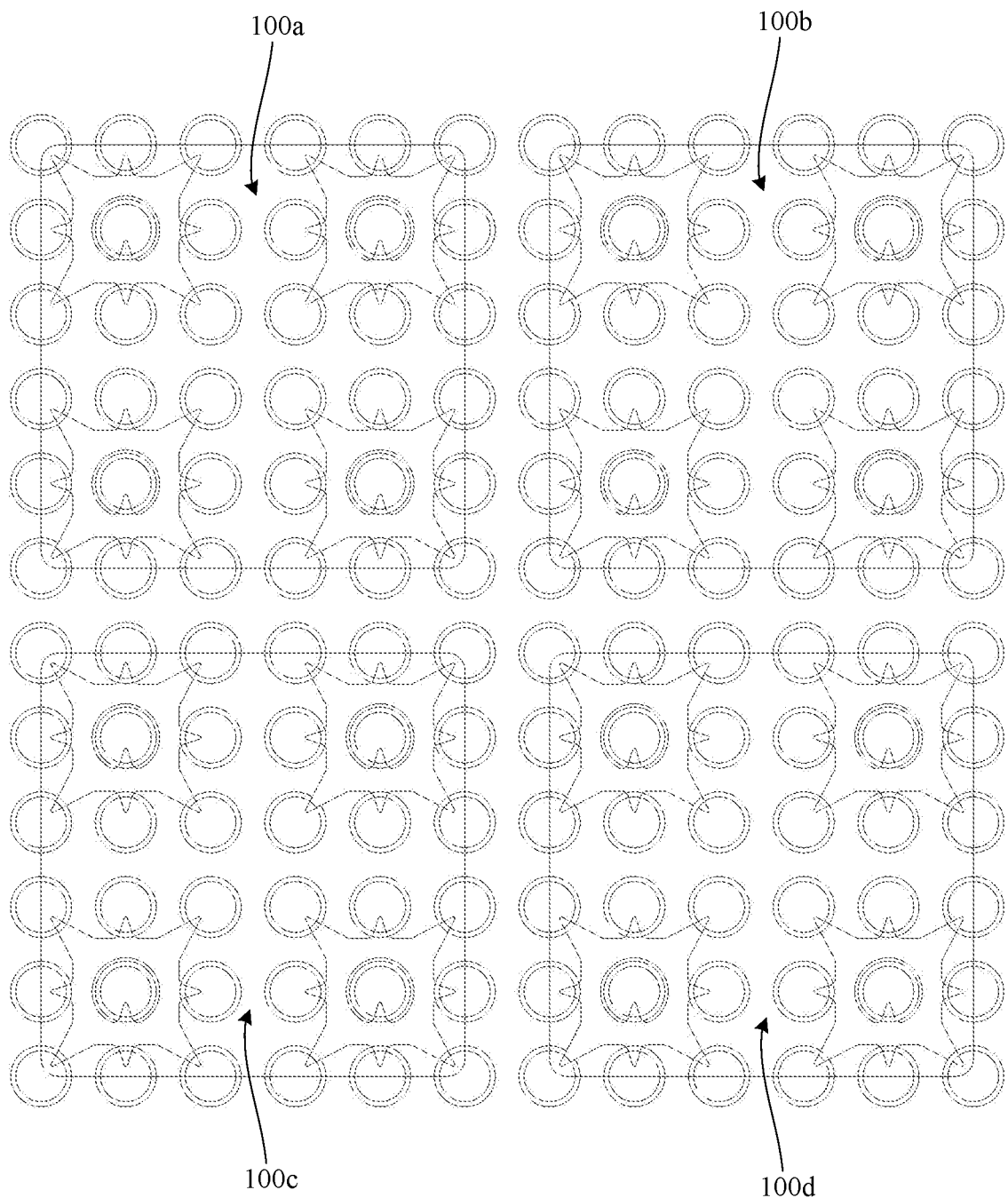
FIG. 6 depicts a relational view of multiple IC device test probes when seated against an IC device, in accordance with one or more embodiments of the disclosure.

Referring to FIG. 6, multiple different or independent IC device test probes 100 are temporarily seated against IC device 34 by IC wafer prober 14. Different or independent IC device test probes 100 shall mean that the independent IC device test probes 100 can transmit or receive relatively different test signal(s), or in other words they need not transmit nor receive the same test signals.

After IC wafer prober 14 seats the IC device 34 against independent IC device test probes 100, test signal(s) are applied by a first IC device test probe 100a and resultingly applied to each contact 50 of an associated 6×6 sub-grid of contacts 50 by respective seated tapered probe tips 120 of the IC device test probe 100a. The test signal(s) are then routed through the IC device 34 by way of the wiring pathway(s) and may be read at a second IC device test probe 100b by way of each contact 50 of an associated 6×6 sub-grid of contacts 50 and by way of respective seated tapered probe tips 120 of the IC device test probe 100b. In another example, the test signal(s) may also be similarly read at a third IC device test probe 100c, at a fourth IC device test probe 100d. At a next test iteration, which may occur simultaneously or in series with the other iteration(s), test signal(s) are similarly applied by second IC device test probe 100b and resultingly may be similarly read at the first IC device test probe 100a, at the third IC device test probe 100c, and/or at a fourth IC device test probe 100d. This type of iterative testing of IC device 34 may occur until each independent IC device test probe 100 that is upon the probe card 22 applies test signals which may be read by one or more other independent IC device test probes 100 that are upon the probe card 22.

An aggregation of the received test signal(s) may be simultaneously or serially received at tester 19 from the receiving IC device test probe(s) 100 for comparison against a known, predetermined, or otherwise expected set of iterative test data, associated with the original iterative test signals. Based on the comparison, tester 19 determines whether the wiring pathway(s) within the IC device 34 have transmitted the iterative test signals accurately or otherwise as expected.

In embodiments, IC device test probes 100a, 100b, 100c, and 100d may be located relative thereto on the probe card 22 such that each of the respective tapered probe tip heads 121 of IC device test probes 100a, 100b, 100c, and 100d may be pressed into one contact 50 that is a part of a grid of contacts 50 that is organized into rows and columns. For example, and as depicted in FIG. 6, respective tapered probe tips 120 of IC device test probe 100a may be seated to each contact 50 of an associated 6×6 sub-grid of contacts 50, respective tapered probe tips 120 of IC device test probe 100b may be seated to each contact 50 of an associated 6×6 sub-grid of contacts 50, respective tapered probe tips 120 of IC device test probe 100c may be seated to each contact 50 of an associated 6×6 sub-grid of contacts 50, and respective tapered probe tips 120 of IC device test probe 100d may be seated to each contact 50 of an associated 6×6 sub-grid of contacts 50. The four 6×6 sub-grid of contacts 50 may together form a 12×12 grid of contacts 50 that are organized in rows and columns. Though, the four 6×6 sub-grid of contacts 50 and associated 12×12 grid of contacts 50 are explicitly described and depicted, for clarity, the sub-grid of contacts 50 may be any number of contacts with the overall number of contacts 50 of IC device 34 being in the hundreds of thousands.

Figure 7:
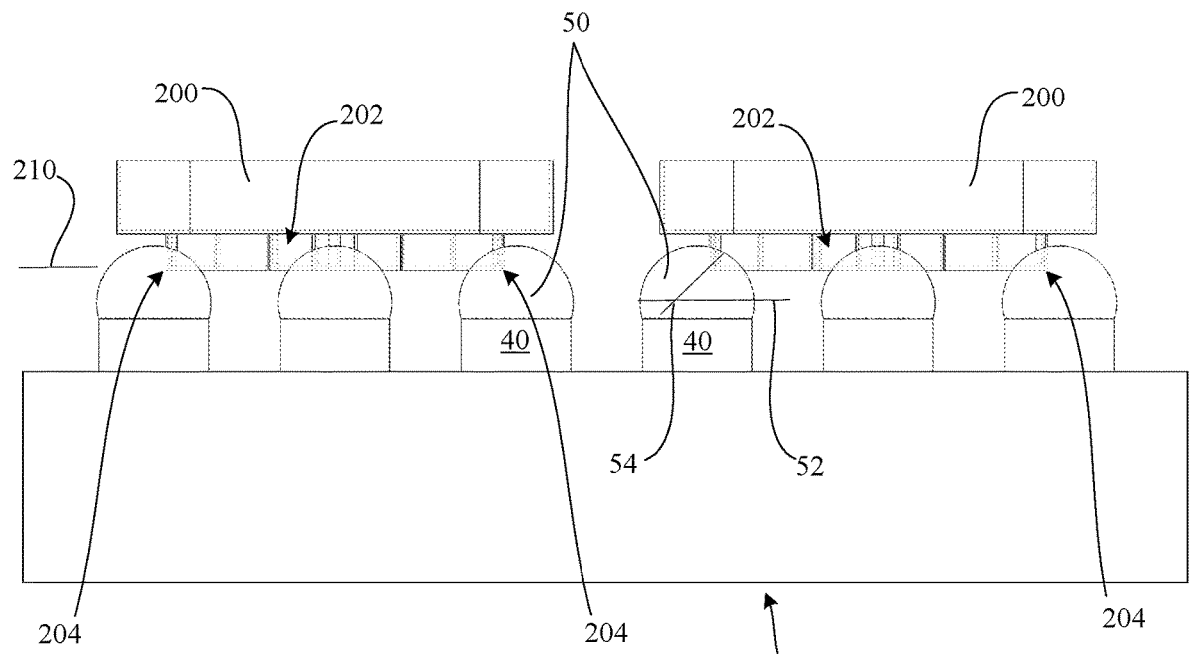
FIG. 7 depicts a cross section view of an IC device test probe that includes a plurality of tapered probe tips seated against an IC device, in accordance with one or more embodiments of the disclosure.

FIG. 7 depicts a cross section view one or more IC device test probes 200 that respectively include cluster 202 of tapered probe tips. In the cross-section view depicted, the one or more IC device test probes 200 are seated against IC device 34 (e.g., each one of the plurality of tapered probe tips are pressed into a respective different contact 50 of IC device 34).

Cluster 202 includes a plurality of tapered probe tips that are each tapered upon or with respect to a same taper plane 210. As such, the thickness of the tapered probe tips diminishes or reduce in dimension toward a respective probe tip head at the permitter of the associated cluster 202 upon the taper plane 210. Taper plane 210 is generally parallel to IC device 34. Each tapered probe has an orthogonal or substantially orthogonal (orthogonal plus or minus an appropriate manufacturing tolerance) corner 204, hereinafter referred to as orthogonal corner 204.

The orthogonal corner 204 of each tapered probe tip, the integration of multiple tapered tips into a single cluster, rigidity of the material of the tapered tips, or the like, may provide for and adequately sharp tip structure to shear an oxide barrier of a respective associated contact 50 to which each tapered probe tip is pressed. As is depicted, the tapered probe tips 220 of one cluster 202 are interconnected, integral, integrated, or the like, to one another and may effectively form a sufficiently strong, hard, and/or rigid structure of multiple tapered probe tips 220. Specifically, the support of these tapered probe tips 220 to the same integrated ring structure increases the strength of the probe tapered probe tips 220 and reduces the stress of the tapered probe tips 220 generated during contact with a corresponding contact 50. This configuration allows for the use of relatively smaller probe tapered probe tips 220, thereby achieving a lower force performance than required by a probe having a free-standing pin or needle probe. In addition, these smaller, sharper, strategically placed tapered probe tips impart higher localized stress on the contacts 50 for purpose of piercing the oxide layer, while minimizing global deformation.

To test the IC device 34, the one or more IC device test probes 200 are temporarily seated against IC device 34 by IC wafer prober 14. For example, the orthogonal corner 204 of each tapered probe tip head is pressed into a respective different contact 50 of IC device 34. Because contact 50 is ductile, contact 50 deforms around the orthogonal corner 204 of the tapered probe tip head. Upon such deformation, any oxide barrier of the contact 50 is broken and an adequate mechanical and electrical connection exists to transmit electrical current, signals, or the like, from the tapered probe tip head to contact 50, or vice versa. In this example, the IC device test probe(s) may be adequately or desirably seated onto the IC device 34 when a respective probe tip head adequately breaks the oxide barrier of the associated contact 50 to which it is pressed.

In another example, a respective equator plane 52 may exist through the equator of each contact 50. Each of the equator planes may be coplanar and may be parallel to taper plane 210. A quarter bisector 54 may exist at a forty-five-degree angle from the equator plane. In this example, the IC device test probe(s) may be adequately or desirably seated onto the IC device 34 when a respective probe tip head meets an appropriate and respective quarter bisector 54 and/or when the appropriate respective quarter bisector 54 bisects the associated orthogonal corner 204 of the probe tip head.

After IC wafer prober 14 seats the IC device 34 against one or more IC device test probes 200, test signal(s) are applied by a first IC device test probe 200 at a first contact 50 or a first sub-array of contacts 50.

The test signal(s) are routed through the IC device 34 by way of the wiring pathway(s) and may be read at a second contact 50 and/or a second sub-array of contacts 50 at a second IC device test probe 200. That is, a respective instance of the same test signal(s) is applied to each contact 50 that is seated against the tapered probe tips of the first IC device test probe 200. After the test signal(s) are routed through the IC device 34, by way of the wiring pathway(s), the test signal(s) are received at the tapered probe tips of the second IC device test probe 200. An aggregation of the received test signal(s) may be received at tester 19 from the second IC device test probe 200 for comparison against a known, predetermined, or otherwise expected set of test data, associated with the original test signal(s). Based on the comparison, tester 19 determines whether the wiring pathway(s) within the IC device 34 have transmitted the test signal(s) accurately or otherwise as expected.

In embodiments, the tapered probe tip heads of the same cluster 202 may be pressed into one contact 50 that is a part of a sub-grid of contacts 50 that is organized into rows and columns. For example, and as depicted, each one of nine tapered probe tip heads of the same cluster 202 may be pressed into one contact 50 of a 3×3 sub-grid of contacts 50 that is organized in rows and columns. Therefore, in the depicted example, a respective instance of the same test signal(s) is applied to each contact 50 of the 3×3 sub-grid of contacts 50 by a respective seated tapered probe tip of the first IC device test probe 200. After the test signal(s) are routed through the IC device 34, by way of the wiring pathway(s), the test signal(s) are received at each contact 50 of a 3×3 sub-grid of contacts 50 by a respective seated tapered probe tip of the second IC device test probe 200.

Figure 8:
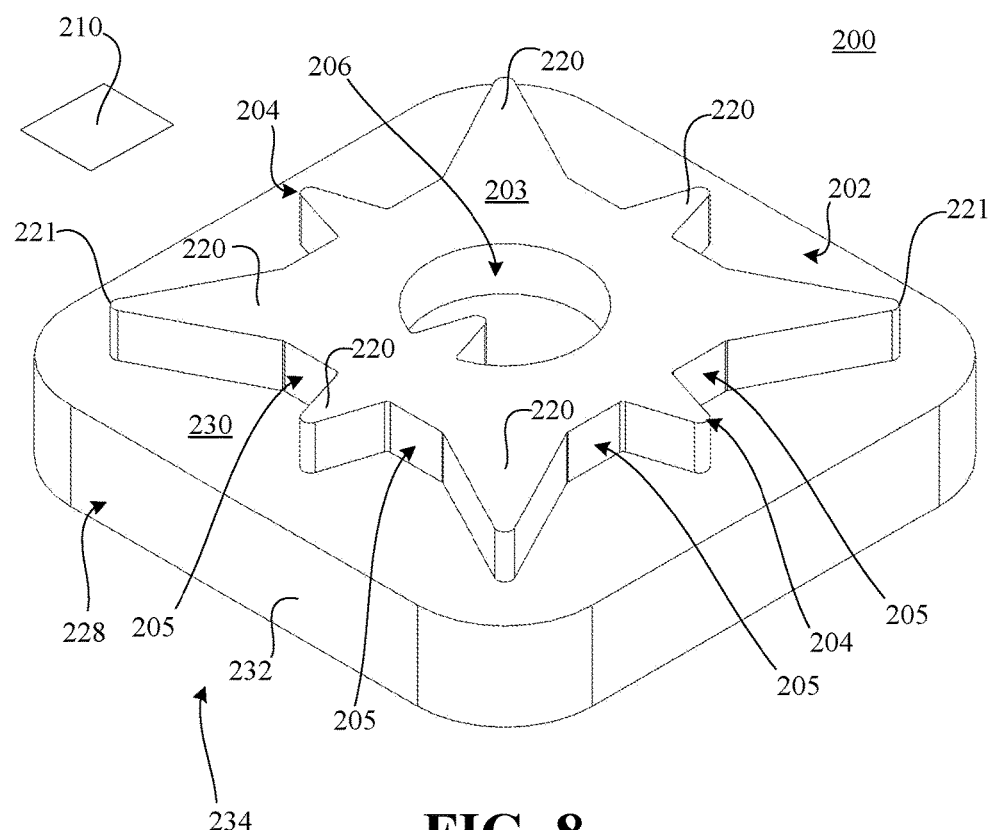
FIG. 8 depicts an isometric view of an IC device test probe that includes a plurality of tapered probe tips, in accordance with one or more embodiments of the disclosure.
Figure 9:
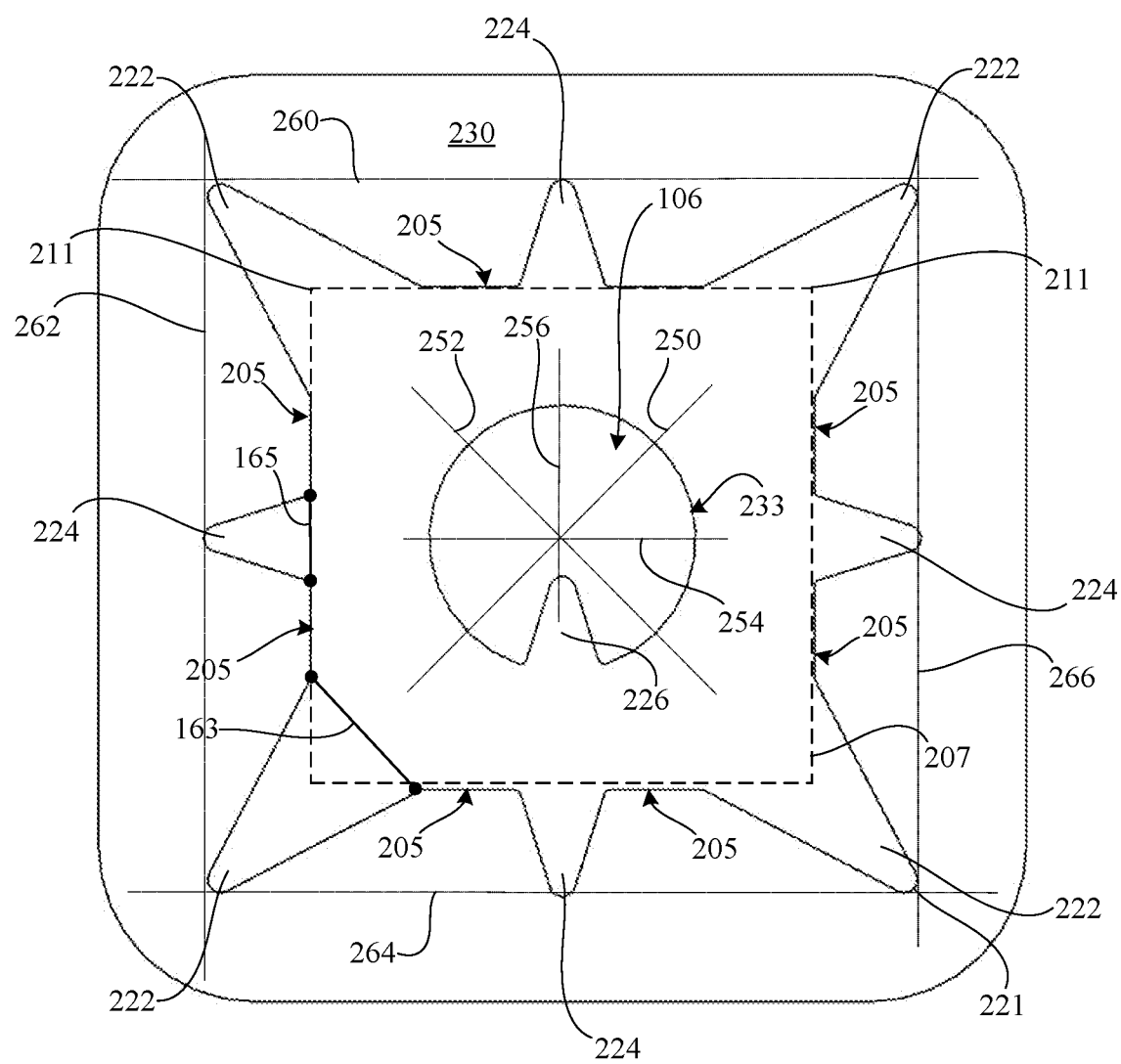
FIG. 9 depicts a normal view of an IC device test probe that includes a plurality of tapered probe tips, in accordance with one or more embodiments of the disclosure.
Figure 10:
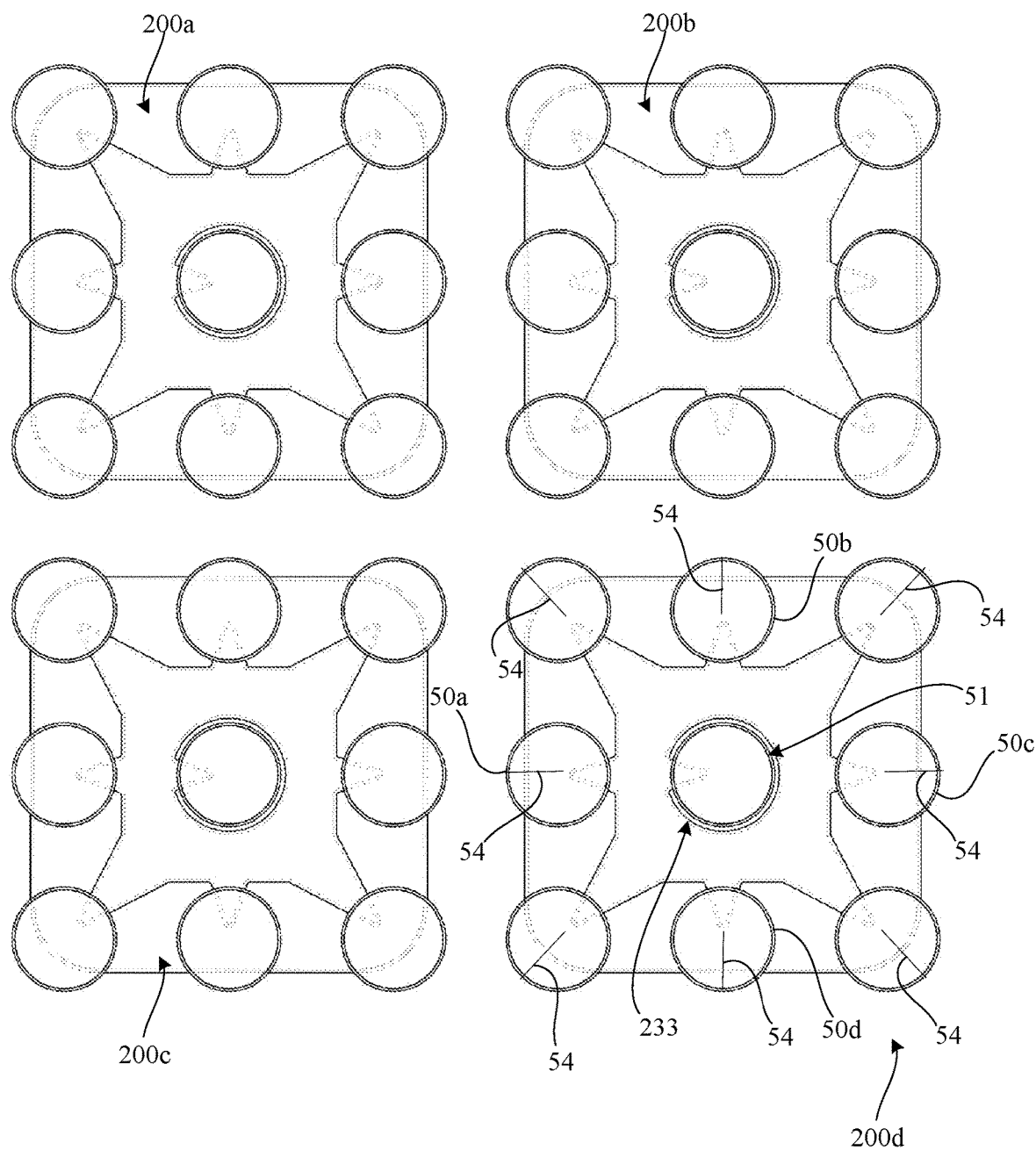
FIG. 10 depicts a relational view of multiple IC device test probes when seated against an IC device, in accordance with one or more embodiments of the disclosure.

Referring to FIG. 8, FIG. 9, and FIG. 10, which depict various views of IC device test probe 200 that includes cluster 202 of tapered probe tips 220 that project or extend from a base 228. Base 228 includes an IC device 34 facing surface 230, hereinafter referred to as bottom surface 230, an opposing surface 234, hereinafter referred to a top surface 234, and one or more sidewalls 232 that connect the bottom surface 230 to the top surface 234. Base 228 is formed of a conductive material, such as a metal. In a particular example, base 228 is a shaped block of copper or other metal. Base 228 is electrically and mechanically bonded to probe card 22. As such, test signal(s) may be transmitted through probe card 22 into base 228 and ultimately into the cluster 202 thereupon.

The IC device test probe 200 includes cluster 202 of tapered probe tips 220. Though one cluster 202 is depicted, IC device test probe 200 may include additional or fewer clusters 202. Each cluster 202 includes a plurality of tapered probe tips 220 that are each tapered upon or with respect to taper plane 210, such that the thickness of each tapered probe tip 220 diminishes toward a respective probe tip head 221 at the permitter of the associated cluster 202 upon the taper plane 210. Cluster 202 is formed of a conductive material, such as a metal. In a particular example, cluster 202 is plated copper or other metal and can include surface plating with a noble metal. Cluster 202 may be formed by photolithographic plating processes. Generally, the test signal(s) received by base 228 from probe card 22 are generally received by the cluster 202 thereupon and more specifically received by the tapered probe tips 220 associated therewith.

Cluster 202 includes a probe tester normal surface 203, which may be coplanar with taper plane 210 and/or parallel with bottom surface 230. Cluster 202 further includes sidewalls that connect the probe tester normal surface 203 with bottom surface 230. The sidewalls of cluster 202 may include sidewalls 205 that may be coplanar with a respective square region 207. Square region 207 may be coplanar with taper plane 210 and/or parallel with bottom surface 230 and may include vertices 211.

As is depicted, the tapered probe tips 220 of cluster 202 are interconnected, integral, integrated, or the like, to one another and may effectively form a sufficiently strong, hard, and/or rigid and integral structure of multiple tapered probe tips 220. Specifically, the support of these tapered probe tips 220 to the same integrated ring structure increases the strength of the probe tapered probe tips 220 and reduces the stress of the tapered probe tips 220 generated during contact with a corresponding contact 50. This configuration allows for the use of relatively smaller probe tapered probe tips 220, thereby achieving a lower force performance than required by a probe having a free-standing pin or needle probe. In addition, these smaller, sharper, strategically placed tapered probe tips impart higher localized stress on the contacts 50 for purpose of piercing the oxide layer, while minimizing global deformation.

Further, the tapered probe tips 220 upon the IC device test probe 200 may effectively self-align the IC device test probe 200 to the IC device 34. Specifically, each tapered probe tip 220 may be configured to contact a spherical or spherical like contact 50 at a location offset from a vertical bisector of that contact 50. When a tapered probe tip 220 contacts or hits a contact 50, tapered probe tip 220 is hitting on the side of contact 50 and will have a natural tendency to be pushed away therefrom. This tendency effectively acts on all tapered probe tip 220 IC device test probe 200 and may effectively align the IC device test probe 200 with IC device 34.

With such an arrangement, the tapered probe tips 220 are generally configured to contact a portion of the contact 50 offset from a central vertical axis thereof. As a result, the center of the contact 50 remains undisturbed through the testing, thereby eliminating the need for a reflow operation. In addition, the orientation and contour of the tapered probe tips 220 may be selected to apply a lateral force on the associated contact 50 to urge the corresponding contact 50 into a desired self-aligned position. By including a plurality of tapered probe tips 220 positioned about the periphery of the ring structure, the tapered probe tips 220 ensure proper self-alignment between the IC device test probe 200 and the sub-grid of contacts 50 regardless of the direction of offset of the contact 50 relative to the tapered probe tips 220 of the IC device test probe 200.

Cluster 202 may further include one or more bisectors that are orthogonal to probe tester normal surface 203. In an example, cluster 202 includes diagonal bisector 250, diagonal bisector 252, normal bisector 254, and normal bisector 256. Diagonal bisector 250, diagonal bisector 252, normal bisector 254, and normal bisector 256 may be respective planes orthogonal to bottom surface 230. As depicted in FIG. 9, diagonal bisector 250 may be orthogonal to diagonal bisector 252 and normal bisector 254 may be orthogonal to normal bisector 256. The diagonal bisector 250, diagonal bisector 252, normal bisector 254, and normal bisector 256 may bisect respective square region 207. Opposite diagonal vertices 211 of square region 207 may lay upon or be otherwise coincident with the same diagonal bisector 250, 252, respectively. As such, diagonal bisector 250 and diagonal bisector 252 diagonally bisect square region 207. Normal bisector 254 may bisect a front side from a rear side of square region 207 and normal bisector 256 may bisect a first side from a second side of square region 207.

Cluster 202 may further include through-hole 206 internal to sidewalls 205 and/or square region 207. Through-hole 206 is generally a void of the material of cluster 202 and/or base 228 and may extend all the way through cluster 202 from probe tester normal surface 203 to or below bottom surface 230. Through-hole 206 may have a diameter 233 that is larger than the diameter of contacts 50 of IC device 34. For example, diameter 233 may be larger than the diameter of contacts 50 of IC device 34 by a predetermined dimension that adequately allows for a respective clearance between through-hole 206 and associated contacts 50 while considering appropriate manufacturing tolerances, locational tolerances, and placement tolerances, and/or the like. Through-hole 206 generally forms internal sidewall(s) of cluster 202 that connect probe tester normal surface 203 to bottom surface 230, or the like.

The tapered probe tips 220 of cluster 202 may be respective permitter regions that may extend from one or more sidewalls of cluster 202. The tapered probe tips 220 may include corner taper tips 222, mesial taper tips 224, and interior taper tip 226.

Both corner taper tips 222 and mesial taper tips 224 taper upon taper plane 210 such that a thickness of the corner taper tips 222 and mesial taper tips 224 diminish or reduce in dimension from square region 207 toward a respective probe tip head 221 thereof. Diagonal bisector 250 may bisect a first pair of opposing corner taper tips 222 and diagonal bisector 252 may bisect a second pair of opposing corner taper tips 222. Similarly, bisector 254 may bisect a first pair of opposing mesial taper tips 224 and bisector 256 may bisect a second pair of opposing mesial taper tips 224. Due to a longer distance from vertices 211 to the probe tip head 221 of corner taper tip 222 relative to the distance from square region 207 to the probe tip head 221 of mesial taper tip 224, the largest or base thickness of the corner taper tip 222 may be greater than the largest thickness of mesial taper tip 224.

Interior taper tip 226 tapers upon taper plane 210 such that a thickness of the interior taper tip 226 diminishes or reduces in dimension from the internal sidewall(s) of through-hole 206 toward a respective probe tip head 221 thereof. Diagonal bisector 250, diagonal bisector 252, bisector 254, bisector 256, or the like, may bisect interior taper tip 226.

Respective probe tip heads 221 of cluster 202 may be located upon perimeter planes 260, 262, 264, and 266 that are orthogonal to probe tester normal surface 203. Perimeter plane 260 and permitter plane 264 may be parallel and perimeter plane 262 and permitter plane 266 may be parallel. Perimeter plane 260, 264 may be orthogonal to perimeter plane 262, 266. As depicted, perimeter planes 260, 262, 264, 266 may be shaped relative thereto as a square that has a center that may be coincident with a center of square region 207 and/or a center of through-hole 206. In an example, a first group of probe tip heads 221 of corner taper tips 222 and mesial taper tips 224 may lay upon or be otherwise coincident with perimeter plane 260, a second group of probe tip heads 221 of corner taper tips 222 and mesial taper tips 224 may lay upon or be otherwise coincident with perimeter plane 262, a third group of probe tip heads 221 of corner taper tips 222 and mesial taper tips 224 may lay upon or be otherwise coincident with perimeter plane 264, and a fourth group of probe tip heads 221 of corner taper tips 222 and mesial taper tips 224 may lay upon or be otherwise coincident with perimeter plane 266.

Corner taper tips 222, mesial taper tips 224, and interior taper tip 226 may have a respective rounded probe tip head 221. Sidewall(s) may connect probe tester normal surface 203 of corner taper tips 222, mesial taper tips 224, and interior taper tip 226 to bottom surface 230. Each tapered probe tip 220 may have orthogonal corner 204 that is formed between bottom surface 230 and the sidewall(s) of corner taper tips 222, sidewall(s) of mesial taper tips 224, and sidewall(s) of interior taper tip 226, respectively.

As depicted in FIG. 10, to test the IC device 34, IC device test probes 200a, 200b, 200c, and 200d are temporarily seated against IC device 34 by IC device tester 10. For example, the orthogonal corner 204 of each tapered probe tip head 221 of each IC device test probe 200a, 200b, 200c, and 200d is pressed into a respective different contact 50 of IC device 34. These associated contacts 50 may be arranged in a grid of rows and columns. Because the contacts 50 are ductile, each sub-grid of contacts 50 deforms around the orthogonal corner 204 of each of the tapered probe tip heads 221 of each IC device test probe 200a, 200b, 200c, and 200d. In this example, the IC device the tapered probe tips 220 may be adequately or desirably seated onto the IC device 34 when a respective probe tip head 221 adequately breaks the associated oxide barrier of the contact 50 to which it is pressed.

In an example, test probes 200*a*, 200*b*, 200*c*, and 200*d* may be adequately or desirably seated onto the IC device 34 when a respective probe tip head 221 meets an appropriate and respective quarter bisector 54 and/or when the appropriate respective quarter bisector 54 bisects the associated orthogonal corner 204 of the probe tip 220. With reference to both FIG. 9 and FIG. 10, when IC device test probe 200*a*, 200*b*, 200*c*, and/or 200*d* is properly aligned with and/or seated with IC device 34, diagonally opposite quarter bisectors 54 may be coincident with diagonal bisector 250 or diagonal bisector 252, as appropriate, and opposite mesial quarter bisectors 54 may be coincident with bisector 254 or diagonal bisector 256, as appropriate.

Upon such seating, an adequate mechanical and electrical connection exists to transmit electrical current, signals, or the like, from each tapered probe tip 220 to the associated contact 50, or vice versa. After IC prober 14 seats IC device test probes 200*a*, 200*b*, 200*c*, and/or 200*d* against IC device 34, test signal(s) are applied by one or more IC device test probes 200*a*, 200*b*, 200*c*, and/or 200*d* to respective contacts 50. The test signal(s) are then routed through the IC device 34 by way of the wiring pathway(s).

In embodiments, the tapered probe tip heads 221 of the same IC device test probe 200*a*, 200*b*, 200*c*, or 200*d* may be pressed into one contact 50 that is a part of a respective sub-grid of contacts 50 that are organized into rows and columns. For example, and as depicted in FIG. 10, each one of nine tapered probe tip heads 221 of the same cluster 202 of IC device test probe 200*a*. 200*b*, 200*c*, or 200*d* may be pressed into one contact 50 of a 3×3 sub-grid of contacts 50 that is organized in rows and columns.

Further, the IC device test probes 200*a*, 200*b*, 200*c*, or 200*d* may be positioned relative to one another upon probe card 22 to enlarge the size of the tested sub-grid of contacts 50 that is organized in rows and columns. As depicted in FIG. 10, IC device test probes 200*a*, 200*b*, 200*c*, or 200*d* are included in probe card 22 so that each one of thirty-six tapered probe tip heads 221 of the IC device test probes 200*a*, 200*b*, 200*c*, or 200*d* may be pressed into one contact 50 of a 6×6 sub-grid of contacts 50 that are organized in rows and columns.

IC device test probes 200*a*, 200*b*, 200*c*, and/or 200*d* may be different or independent IC device test probes such that the independent IC device test probes 200*a*, 200*b*, 200*c*, or 200*d* can transmit or receive relatively different test signal(s). In other words, IC device test probes 200*a*. 200*b*, 200*c*, and/or 200*d* need not transmit nor receive the same test signals at the same time.

In an example, after IC prober 14 seats IC device 34 to the independent IC device test probes 200*a*, 200*b*, 200*c*, and/or 200*d*, test signal(s) are applied by IC device test probe 200*a* and resultingly applied to each contact 50 of an associated 6×6 sub-grid of contacts 50 by respective seated tapered probe tips 220 thereof. The test signal(s) are then routed through the IC device 34 by way of the wiring pathway(s) and may be read at IC device test probe 200*b* by way of each contact 50 of an associated 6×6 sub-grid of contacts 50 and by way of respective seated tapered probe tips 220 thereof. In another example, the test signal(s) may also be similarly read at IC device test probe 200*c*, at IC device test probe 200*d*. At a next test iteration, which may occur simultaneously or in series with the other iteration(s), test signal(s) are similarly applied by IC device test probe 200*b* and resultingly may be similarly read at IC device test probe 200*a*, at IC device test probe 200*c*, and/or at IC device test probe 200*d*. This type of iterative testing of IC device 34 may occur until each independent IC device test probe 200*a*, 200*b*, 200*c*, and/or 200*d* that is upon the probe card 22 applies test signals which may be read by one or more other independent IC device test probes 200*a*, 200*b*, 200*c*, and/or 200*d* that are upon the probe card 22.

An aggregation of the received test signal(s) may be iteratively received at tester 19 from the receiving IC device test probe(s) 200*a*, 200*b*, 200*c*, or 200*d* for comparison against a known, predetermined, or otherwise expected set of test data, associated with the original test signal(s). Based on the comparison, tester 19 determines whether the wiring pathway(s) within the IC device 34 have transmitted the applicable test signals accurately or otherwise as expected.

Figure 11:
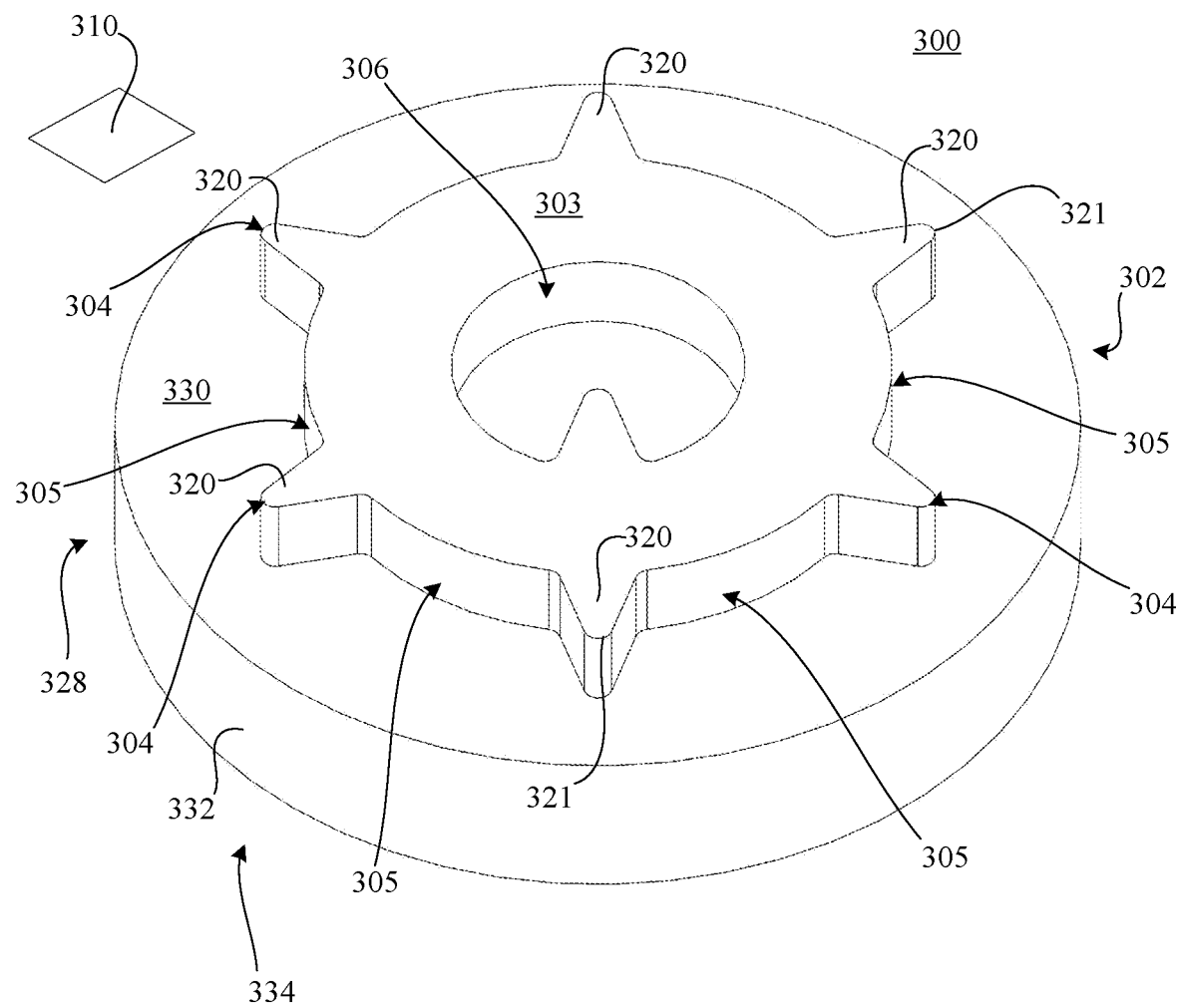
FIG. 11 depicts an isometric view of an IC device test probe that includes a plurality of tapered probe tips, in accordance with one or more embodiments of the disclosure.
Figure 12:
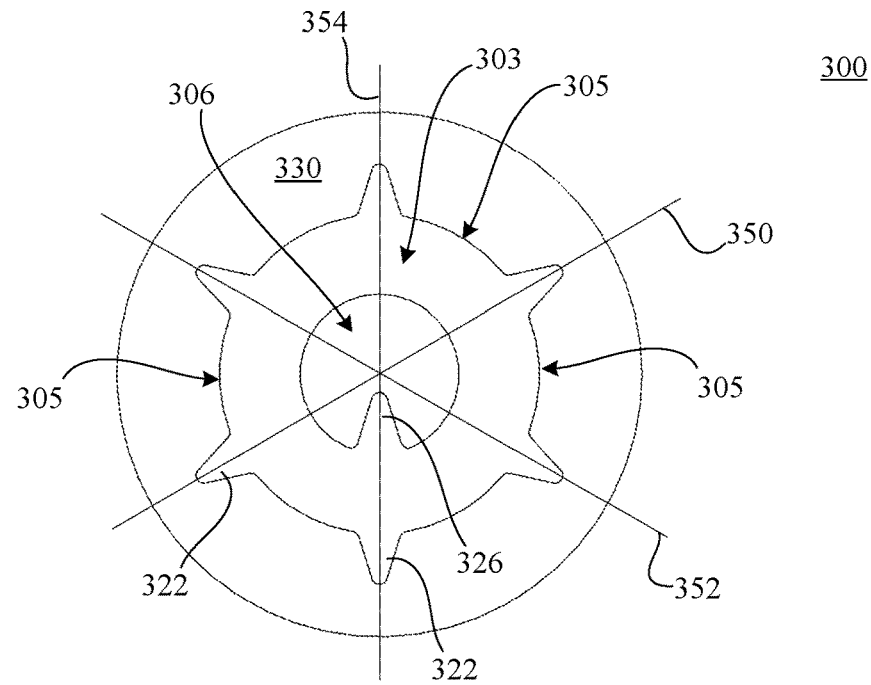
FIG. 12 depicts a normal view of an IC device test probe that includes a plurality of tapered probe tips, in accordance with one or more embodiments of the disclosure.
Figure 13:
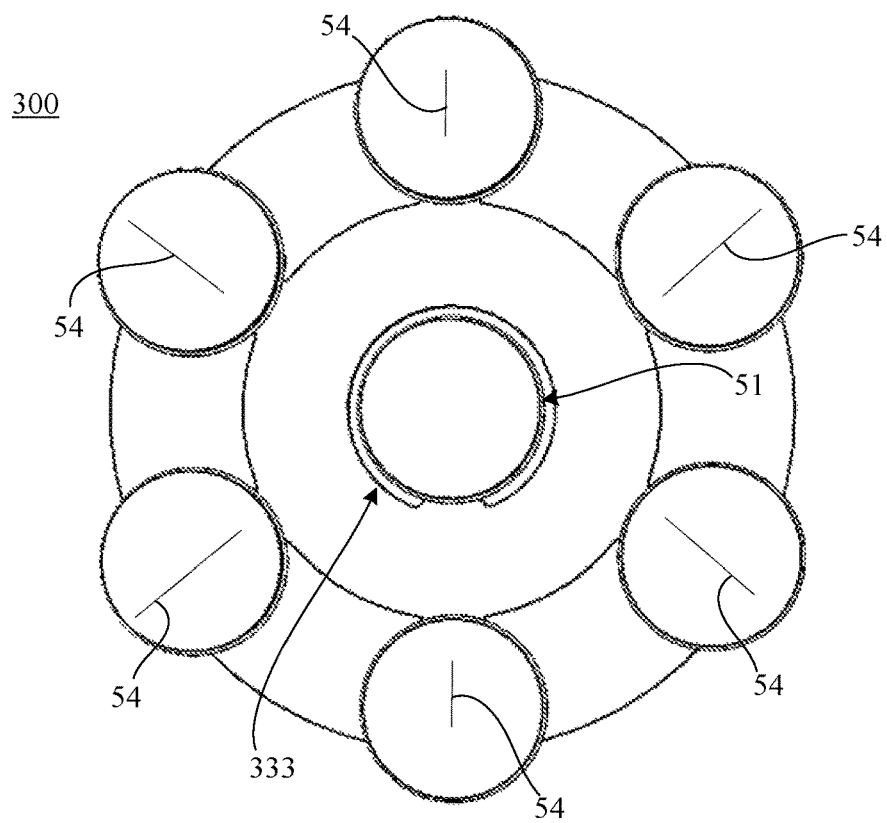
FIG. 13 depicts a relational view a plurality of tapered probe tips when seated against an IC device, in accordance with one or more embodiments of the disclosure.

Referring to FIG. 11, FIG. 12, and FIG. 13, which depict various views of IC device test probe 300 that includes cluster 302 of tapered probe tips 320 that project or extend from a base 328. Base 328 includes an IC device 34 facing surface 330, hereinafter referred to as bottom surface 330, an opposing surface 334, hereinafter referred to a top surface 334, and one or more sidewalls 332 that connect the bottom surface 330 to the top surface 334. Base 328 is formed of a conductive material, such as a metal. In a particular example, base 328 is a shaped block of copper or other metal. Base 328 may be mechanically and electrically bonded to probe card 22. As such, test signal(s) may be transmitted through probe card 22 into base 328 and ultimately into the cluster 302 thereupon.

The IC device test probe 300 includes clusters 302 of tapered probe tips 320. Though one cluster 302 is depicted, IC device test probe 300 may include additional or fewer clusters 302. Cluster 302 includes a plurality of tapered probe tips 320 that are each tapered upon or with respect to taper plane 310, such that the thickness of each tapered probe tip 320 diminishes toward a respective probe tip head 321 at the permitter of the associated cluster 302 upon the taper plane 310. Cluster 302 is formed of a conductive material, such as a metal. In a particular example, cluster 302 is a plated copper or other metal, and can include surface plating with a noble metal. In one example, cluster 302 is formed by photolithographic plating processes that deposit the metal(s) onto a surface 330 of base 128. Generally, the test signal(s) received by base 328 from probe card 22 are generally received by the cluster 302 thereupon and more specifically received by the tapered probe tips 320 associated therewith.

Cluster 302 includes a probe tester normal surface 303, which may be coplanar with taper plane 310 and/or parallel with bottom surface 330. Cluster 302 further includes sidewall(s) that connect the probe tester normal surface 303 with bottom surface 330. The sidewalls of cluster 302 may include sidewalls 305 that may together form portion(s) of a circle. In other words, various sidewalls of cluster 302 may have a same radius and a same center and may together form portion(s) of a circle.

As is depicted, the tapered probe tips 320 of one cluster 302 are interconnected, integral, integrated, or the like, to one another and may effectively form a sufficiently strong, hard, and/or rigid structure of multiple tapered probe tips 320. Specifically, the support of these tapered probe tips 320 to the same integrated ring structure increases the strength of the probe tapered probe tips 320 and reduces the stress of the tapered probe tips 320 generated during contact with a corresponding contact 50. This configuration allows for the use of relatively smaller probe tapered probe tips 320, thereby achieving a lower force performance than required by a probe having a free-standing pin or needle probe. In addition, these smaller, sharper, strategically placed tapered probe tips impart higher localized stress on the contacts 50 for purpose of piercing the oxide layer, while minimizing global deformation.

Further, the tapered probe tips 320 upon the IC device test probe 300 may effectively self-align the IC device 34 to IC device test probe 300. Specifically, each tapered probe tip 320 may be configured to contact a spherical or spherical like contact 50 at a location offset from a vertical bisector of that contact 50. When a tapered probe tip 320 contacts or hits a contact 50, tapered probe tip 320 is hitting on the side of contact 50 and will have a natural tendency to be pushed away. This tendency effectively acts on all tapered probe tip 320 of IC device test probe 300 and may effectively align the IC device 34 with IC device test probe 300.

With such an arrangement, the tapered probe tips 320 are generally configured to contact a portion of the contact 50 offset from a central vertical axis thereof. As a result, the center of the C4 contact 50 remains undisturbed through the testing, thereby eliminating the need for a reflow operation. In addition, the orientation and contour of the tapered probe tips 320 may be selected to apply a lateral force on the associated contact 50 to urge the corresponding contact 50 into a desired self-aligned position. By including a plurality of tapered probe tips 320 positioned about the periphery of the ring structure, the tapered probe tips 320 ensure proper self-alignment between the IC device test probe 300 and the sub-grid of contacts 50 regardless of the direction of offset of the contact 50 relative to the tapered probe tips 320 of the IC device test probe 300.

Cluster 302 may further include one or more bisectors that are orthogonal to probe tester normal surface 303. In an example, cluster 302 includes bisectors 350, 352, and 354. Bisectors 350, 352, and 354 may be respective planes orthogonal to taper plane 310, orthogonal to bottom surface 330, and located through the center of sidewalls 305 and may be sixty-degrees apart, as depicted. Cluster 302 may further include through-hole 306 internal to, and sharing the center of, sidewalls 305. Through-hole 306 is generally a void of the material of cluster 302 and/or base 328 and may extend all the way through cluster 302 from probe tester normal surface 303 to or below bottom surface 330. Through-hole 306 may have a diameter 333 that is larger than the diameter of contacts 50 of IC device 34. For example, diameter 333 may be larger than the diameter of contacts 50 of IC device 34 by a predetermined dimension that adequately allows for a respective clearance between through-hole 306 and associated contact 50 while considering appropriate manufacturing tolerances, locational tolerances, and placement tolerances, and/or the like. Through-hole 306 generally forms internal sidewall(s) of cluster 302 that connect probe tester normal surface 303 to bottom surface 330, or the like.

The tapered probe tips 320 of each cluster 302 may be respective permitter regions that may extend from the sidewall(s) 305 of cluster 302. The tapered probe tips 320 may include perimeter taper tips 322 and interior taper tip 326.

Perimeter taper tips 322 and interior taper tip 326 taper upon taper plane 310 such that a thickness of the perimeter taper tips 322 diminish or reduce in dimension from sidewall(s) 305 toward a respective probe tip head 321 thereof. Bisector 350 may bisect a first pair of opposing perimeter taper tips 322, bisector 352 may bisect a second pair of opposing perimeter taper tips 322, and bisector 354 may bisect a third pair of opposing perimeter taper tips 322.

Interior taper tip 326 tapers upon taper plane 310 such that a thickness of the interior taper tip 326 diminishes or reduces in dimension from the internal sidewall(s) of through-hole 306 toward a respective probe tip head 321 thereof. Bisector 350, 352, 354, or the like, may bisect interior taper tip 326. Respective probe tip heads 321 of cluster 302 may extend from respective sidewall(s) 305. The sidewalls 305 may form or lay upon a circular plane has a center that may be coincident with a center of through-hole 306. In an example, each probe tip head 321 of perimeter taper tips 322 may lay upon or be otherwise coincident with perimeter circular plane.

Perimeter taper tips 322 and interior taper tip 326 may have a respective rounded probe tip head 321. Sidewall(s) of such rounded probe tip head 321 may connect probe tester normal surface 303 of perimeter taper tips 322 and interior taper tip 326 to bottom surface 330. Each tapered probe tip 320 may have orthogonal corner 304 that is formed between bottom surface 330 and the sidewall(s) of perimeter taper tips 322 and interior taper tip 326, respectively. The orthogonal corner 304 of each tapered probe tips, the integration of multiple tapered tips into a single cluster, rigidity of the material of the tapered tips may provide for and adequately sharp tip structure to shear an oxide barrier of a respective associated contact 50 to which each tapered probe tip is pressed.

As depicted in FIG. 13, to test the IC device 34, IC device test probe 300 is temporarily seated against IC device 34 by IC device tester 10. For example, the orthogonal corner 304 of each tapered probe tip head 321 of each IC device test probe 300 is pressed into a respective different contact 50 of IC device 34. These associated contacts 50 may be arranged in a hexagonal grid of offset rows and columns. Because the contacts 50 are pliable, each hexagonal grid of contacts 50 deforms around the orthogonal corner 304 of each of the tapered probe tip heads 321 of IC device test probe 300. In this example, the IC device test probe(s) may be adequately or desirably seated onto the IC device 34 when a respective probe tip head adequately breaks the oxide barrier of the associated contact 50 to which it is pressed.

In an example, IC device test probe 300 may be adequately or desirably seated onto the IC device 34 when a respective probe tip head 321 meets an appropriate and respective quarter bisector 54 of contact 50 and/or when the appropriate respective quarter bisector 54 of contact 50 bisects the associated orthogonal corner 304 of the probe tip 320. With reference to both FIG. 12 and FIG. 13, when IC device test probe 300 is properly aligned with and/or seated with IC device 34, respective quarter bisectors 54 may be coincident with bisector 350, 352, 354, as appropriate.

Upon seating of IC device 34 to IC device test probe 300, an adequate mechanical and electrical connection exists to transmit electrical current, signals, or the like, from each tapered probe tip 320 to the associated contact 50, or vice versa. After IC prober 14 seats IC device 34 to IC device test probes 300, test signal(s) are applied by IC device test probes 300 to respective contacts 50. The test signal(s) are then routed through the IC device 34 by way of the wiring pathway(s). The test signal(s) may be received by one or more other instances of IC device test probe 300, like the description the IC device test probes 300a. 300b, 300c, 300d, or the like.

In embodiments, the tapered probe tip heads 321 of the IC device test probe 300 may be pressed into one contact 50 that is a part of a respective hexagonal sub-grid of contacts 50 that are organized into offset rows and columns. For example, and as depicted in FIG. 13, each one of seven tapered probe tip heads 321 of the same cluster 302 of IC device test probe 300 may be pressed into one contact 50 of a hexagonal sub-grid of contacts 50 that is organized in offset rows and columns. Further, multiple IC device test probes 300 may be positioned relative to one another upon probe card 22 to enlarge the size of the tested sub-grid of contacts 50 of a hexagonal sub-grid of contacts 50 that are organized into offset rows and columns.

The multiple IC device test probes 300 may be different or independent IC device test probes such that the multiple independent IC device test probes 300 can transmit or receive relatively different test signal(s). In other words, multiple independent IC device test probes 300 need not transmit nor receive the same test signals at the same time.

In an example, after IC device tester 10 seats the multiple independent IC device test probes 300 against IC device 34, test signal(s) are applied by a first IC device test probe 300 and resultingly applied to each contact 50 of an associated hexagonal sub-grid of contacts 50 by respective seated tapered probe tips 220 thereof. The test signal(s) are then routed through the IC device 34 by way of the wiring pathway(s) and may be read at a second, third, fourth, or the like, IC device test probe 300 by way of each contact 50 of an associated therewith. In another example, the test signal(s) may also be similarly read at IC device test probe 200c, at IC device test probe 200d. At a next test iteration, which may occur simultaneously with or serially to the other iterations, test signal(s) are similarly applied by the second IC device test probe 300 and resultingly may be similarly read at the first, third, fourth, or the like. IC device test probe 300. This type of iterative testing of IC device 34 may occur until each multiple independent IC device test probe 300 that is upon the probe card 22 applies test signals which may be read by one or more other independent IC device test probes 300 that are upon the probe card 22.

An aggregation of the received test signal(s) may be iteratively received at tester 19 from the receiving multiple independent IC device test probe(s) 300 for comparison against a known, predetermined, or otherwise expected set of iterative test data, associated with the original iterative test signals. Based on the comparison, tester 19 determines whether the wiring pathway(s) within the IC device 34 have transmitted the applicable test signals accurately or otherwise as expected.

Figure 14:
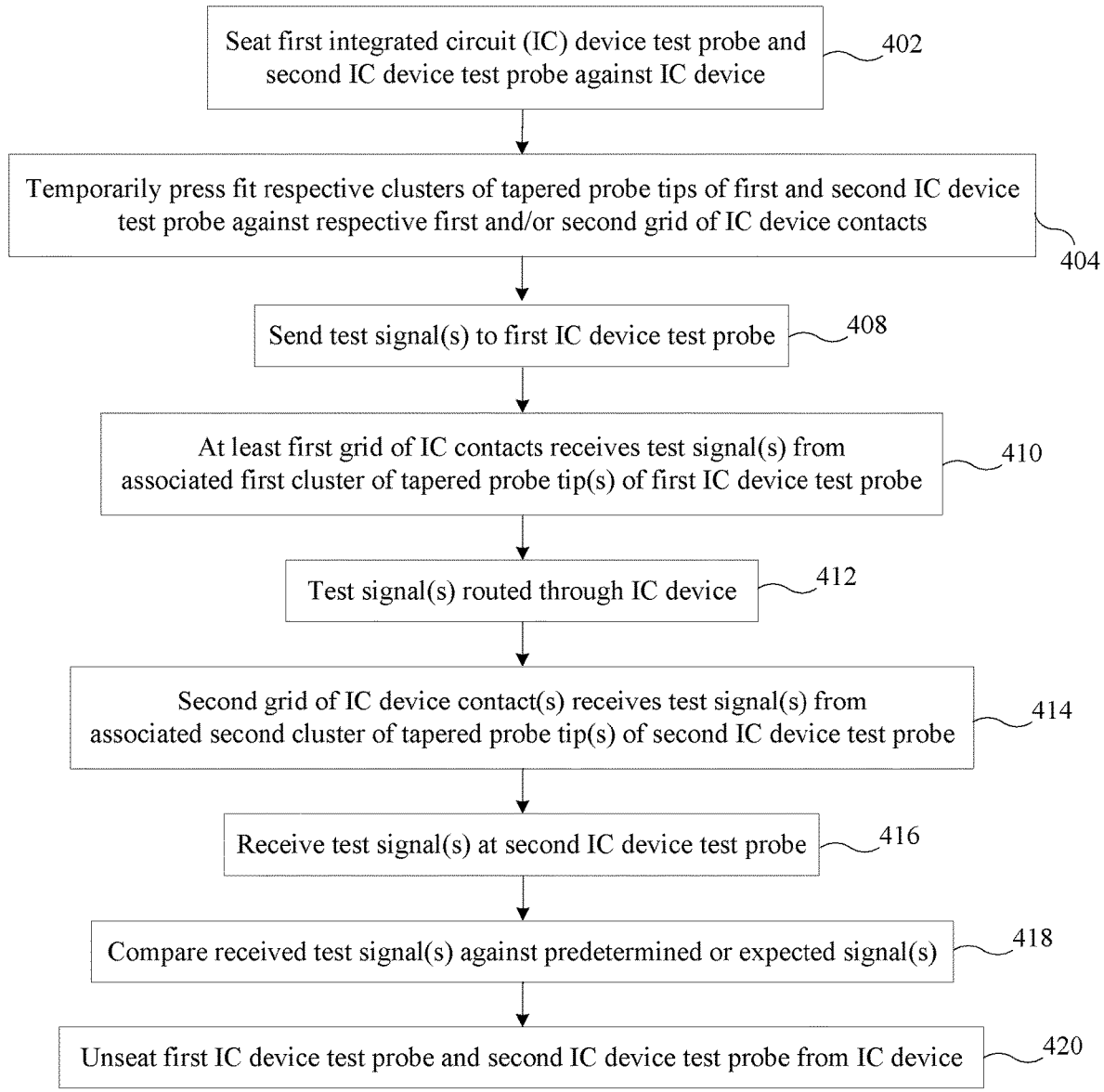
FIG. 14 depicts an exemplary method of testing an IC device with one or more IC device test probes that respectively include a plurality of tapered probe tips, in accordance with one or more embodiments of the disclosure.

FIG. 14 depicts an exemplary method 400 of testing IC device 34 with one or more IC device test probes 100, 200, 300, or the like, that respectively include a plurality of tapered probe tips, in accordance with one or more embodiments of the disclosure. Method 400 of testing the IC device 34 may be referred to as an electrical characterization of the IC device 34 by IC device tester 10.

At block 402, IC device tester 10 seats probe card 22 that includes the one or more IC device test probes 100, 200, 300, or the like, to IC device 34. This seating of probe card 22 to IC device 34 results in a first IC device test probe (e.g., IC device test probe 100, 200, 300, or the like) and/or a second IC device probe both being seated to respective contacts 50 of IC device 34. Further, this seating at block 404 may result in a temporary pressed of one or more first cluster(s) of tapered probe tips that is/are upon the first IC device test probe into respective contacts 50 of IC device 34 and in a temporary pressed of at least one or more second cluster(s) of tapered probe tips that is/are upon the second IC device test probe into respective contacts 50 of IC device 34.

At block 408, IC device tester 10 sends test signal(s) through the first IC device test probe. For example, at block 410, test signal(s) are applied to the associated grid(s) of contacts 50 of IC device 34 by the first IC device test probe by respective seated tapered probe tips of the one or more first cluster(s). At block 412, the test signal(s) are routed through the IC device 34 by way of the wiring pathway(s) therein.

At block 414, the test signal(s) are received (as appropriate dictated by the design, function, or the like, of the wiring pathways) by grid(s) of contacts 50 of IC device 34 associated with the second IC device test probe. In other words, the seated tapered probe tips one or more second clusters of the second IC device test probe receive the test signal(s) from the associated grid(s) of contacts 50. Or more generally, at block 416, the second IC device test probe receives an aggregation of the received the test signal(s).

At block 418, tester 19 receives the aggregation of the test signal(s) from the second IC device test probe for comparison against a known, predetermined, or otherwise expected set of iterative test data, associated with the original test signal(s). Based on the comparison, tester 19 determines whether the wiring pathway(s) within the IC device 34 have transmitted the applicable test signals accurately or otherwise as expected with regard to an expected electrical characterization of the IC device 34. At block 420, when testing of the IC device 34 is completed (e.g., when iterative testing of each die of a wafer is completed), IC device tester 10 unseats the first IC device test probe and the second IC device test probe from IC device 34.

For clarity, embodiment(s) of the present disclosure are directed to system(s) and/or method(s) that provide an IC device test probe with one or more clusters of a plurality of tapered probe tips that taper upon a taper plane that is orthogonal to a seating direction or force vector of the IC device test probe toward the IC device. Each of the plurality of tapered probe tips is seated against one contact 50 of the IC device 34. For example, the IC device test probe is moved vertically downward against the IC device 34 (i.e., the taper plane would resultantly be horizontal). These contacts 50 may form a grid of contacts 50 arranged in rows and columns, arranged in offset rows/columns, or the like. In this manner, the IC device test probe is seated against multiple contacts 50 and may therefore apply associated test signal(s) to these contacts 50 serially, simultaneously, or the like. This IC device test probe, with the plurality of tapered probe tips, effectively allows the seating of the IC device test probe with small pitch IC devices 34 and associated testing thereof through the plurality of tapered probe tips and associated IC device 34 contacts 50. This allows for electrical characterization of the IC device 34 by associated same test signal(s) through the IC device test probe and ultimately through multiple contacts 50. Further, the force vector associated with seating the IC device test probe against the IC device 34 contacts 50 is effectively spread across multiple contacts 50. This distributed force vector may relatively limit or reduce potential damage to the associated contacts 50.

The accompanying figures and this description depicted and described embodiments of the disclosure, and features and components thereof. Those skilled in the art will appreciate that any nomenclature used in this description was merely for convenience, and thus the disclosure should not be limited by the specific process identified and/or implied by such nomenclature. Therefore, it is desired that the embodiments described herein be considered in all respects as illustrative, not restrictive, and that reference be made to the appended claims for determining the scope of the disclosure.

References herein to terms such as "vertical", "horizontal", or the like are made by way of example, and not by way of limitation, to establish a frame of reference. The term "horizontal" as may be used herein is defined as a plane parallel to the conventional plane or surface of the IC device 34 that contains contacts 50 that are or may be probed, regardless of the actual spatial orientation of the IC device 34. The term "vertical" refers to a direction perpendicular to the horizontal, as just defined. Terms, such as "on", "above", "below", "side" (as in "sidewall"), "higher", "lower", "over", "beneath," "under", "top," "bottom," "left," "right," or the like, are used with respect to the horizontal plane. It is understood that various other frames of reference may be employed for describing the present disclosure without departing from the spirit and scope of the present disclosure.

What is claimed is:

1. A system to test an integrated circuit (IC) device, the system comprising:
   an IC device comprising a grid of contacts arranged in rows and columns; and
   a first IC device test probe comprising a first cluster of a first plurality of rigid and integrated tapered probe tips that taper upon a plane that is orthogonal to a seating direction of the first IC device test probe toward the IC device.

2. The system of claim 1, wherein the first IC device test probe is configured to pass a test signal though the first cluster of the first plurality of rigid and integrated tapered probe tips to a first sub-grid of contacts arranged in rows and columns once seated against the first plurality of rigid and integrated tapered probe tips.

3. The system of claim 2, further comprising:
   a second IC device test probe comprising a second cluster of a second plurality of rigid and integrated tapered probe tips that taper upon the plane.

4. The system of claim 3, wherein the second IC device test probe is configured to receive the test signal though the second cluster of the second plurality of rigid and integrated tapered probe tips from one or more second sub-grid of contacts arranged in rows and columns once seated against the second plurality of rigid and integrated tapered probe tips.

5. The system of claim 2, wherein at least one electrical pathway electrically connects at least one of the first sub-grid of contacts to at least one of the one or more second sub-grid of contacts.

6. The system of claim 2, wherein the grid of contacts is a n×m grid of contacts, wherein the first sub-grid of contacts is a subset of n×m grid of contacts, and wherein a pitch between neighboring contacts of the n×m grid of contacts is an integer multiple of a pitch between neighboring rigid and integrated tapered probe tips of the first plurality of rigid and integrated tapered probe tips.

7. The system of claim 1, wherein the first cluster of the first plurality of rigid and integrated tapered probe tips comprises:
   a probe tester normal surface that is coplanar with the taper plane, wherein each of the first plurality of rigid and integrated tapered probe tips share the probe tester normal surface;
   a plurality of corner taper tips, wherein one corner taper tip is located at each corner of a square region;
   a plurality of mesial taper tips, wherein one mesial taper tip is located between neighboring corner taper tips;
   a through hole from the probe tester normal surface; and
   an internal taper tip within the through hole.

8. The system of claim 7, wherein the first cluster of the first plurality of rigid and integrated tapered probe tips that share the probe tester normal surface provides for respective adequately sharp tip structures to shear an oxide barrier of a respective associated contact of the first sub-grid of contacts.

9. The system of claim 2 wherein the first IC device test probe self-aligns to the first sub-grid of contacts.

10. The system of claim 2, wherein the first cluster of the first plurality of rigid and integrated tapered probe tips distributes join forces between the IC device and the first IC device test probe across the first sub-grid of contacts.

11. A system to test an integrated circuit (IC) device, the system comprising:
    an IC device comprising a grid of contacts arranged in rows and columns; and
    a first IC device test probe comprising a plurality of first clusters, each first cluster comprising a first plurality of rigid and integrated tapered probe tips that taper upon a taper plane that is orthogonal to a seating direction of the first IC device test probe toward the IC device.

12. The system of claim 11, wherein the first IC device test probe is configured to pass a test signal though the plurality of first clusters to a first sub-grid of contacts arranged in rows and columns once seated against the first plurality of rigid and integrated tapered probe tips.

13. The system of claim 12, further comprising:
    a second IC device test probe comprising a plurality of second clusters, each second cluster comprising a second plurality of rigid and integrated tapered probe tips that taper upon the taper plane.

14. The system of claim 13, wherein the second IC device test probe is configured to receive the test signal through the plurality of second clusters from a second sub-grid of contacts arranged in rows and columns once seated against the second plurality of rigid and integrated tapered probe tips.

15. The system of claim 14, wherein at least one electrical pathway electrically connects at least one of the first sub-grid of contacts to at least one of second sub-grid of contacts.

16. The system of claim 12, wherein the grid of contacts is a n×n grid of contacts, wherein the first sub-grid of contacts is a subset of n×n grid of contacts, and wherein a pitch between neighboring contacts of the n×n grid of contacts is an integer multiple of a pitch between neighboring rigid and integrated tapered probe tips.

17. The system of claim 11, wherein each first cluster further comprises:
    a probe tester normal surface that is coplanar with the taper plane, wherein each of the first plurality of rigid and integrated tapered probe tips share the probe tester normal surface;
    a plurality of corner taper tips, wherein one corner taper tip is located at each corner of a square region;
    a plurality of mesial taper tips, wherein one mesial taper tip is located between respective corner taper tips;
    a through hole from the probe tester normal surface; and
    an internal taper tip within the through hole.

18. The system of claim 17, wherein the first plurality of rigid and integrated tapered probe tips that share the probe tester normal surface provides for respective adequately sharp tip structures to shear an oxide barrier of a respective associated contact of the first sub-grid of contacts.

19. The system of claim 12, wherein the first IC device test probe self-aligns to the first sub-grid of contacts and wherein a plurality of first clusters distributes join forces between the IC device and the first IC device test probe across the first sub-grid of contacts.

20. A method of testing an integrated circuit (IC) device comprising:

vertically seating a first IC device test probe and a second IC device test probe upon an IC device;

transmitting a test signal to the first IC device test probe that comprises a first cluster of a first plurality of rigid and integrated tapered probe tips that taper upon a horizontal taper plane;

passing the test signal through the first cluster of the first plurality of rigid and integrated tapered probe tips to a first sub-grid of contacts of the IC device, the first sub-grid of contacts being arranged in rows and columns; and receiving the test signal though a second cluster of a second plurality of rigid and integrated tapered probe tips from a second sub-grid of contacts of the IC device, the second sub-grid of contacts arranged in rows and columns.

* * * * *